US011871583B2

(12) United States Patent
Sato et al.

(10) Patent No.: US 11,871,583 B2
(45) Date of Patent: *Jan. 9, 2024

(54) FERROELECTRIC MEMORY DEVICES

(71) Applicant: Kepler Computing, Inc., San Francisco, CA (US)

(72) Inventors: Noriyuki Sato, Hillsboro, OR (US); Tanay Gosavi, Portland, OR (US); Niloy Mukherjee, San Ramon, CA (US); Amrita Mathuriya, Portland, OR (US); Rajeev Kumar Dokania, Beaverton, OR (US); Sasikanth Manipatruni, Portland, OR (US)

(73) Assignee: KEPLER COMPUTING INC., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/478,849

(22) Filed: Sep. 17, 2021

(65) Prior Publication Data

US 2023/0076825 A1     Mar. 9, 2023

Related U.S. Application Data

(63) Continuation of application No. 17/465,792, filed on Sep. 2, 2021.

(51) Int. Cl.
*H10B 53/30* (2023.01)
*H10B 53/10* (2023.01)
(Continued)

(52) U.S. Cl.
CPC ....... *H10B 53/30* (2023.02); *H01L 21/76802* (2013.01); *H01L 23/528* (2013.01);
(Continued)

(58) Field of Classification Search
CPC ... H10B 53/10; H10B 53/30; H01L 21/76802; H01L 23/528; H01L 23/53209;
(Continued)

(56) References Cited

U.S. PATENT DOCUMENTS

| 5,739,563 A | 4/1998 | Kawakubo et al. |
| 6,177,351 B1 | 1/2001 | Beratan et al. |

(Continued)

FOREIGN PATENT DOCUMENTS

| DE | 102015015854 A1 | 6/2017 |
| JP | 2006352005 A | 12/2006 |

(Continued)

OTHER PUBLICATIONS

Coll et al., "Nanocrystalline Ferroelectric BiFeO3 Thin Films by Low-Temperature Atomic Layer Deposition," Chem. Mater. 2015, 27, 18, 6322-6328Publication Date: Aug. 20, 2015. https://doi.org/10.1021/acs.chemmater.5b02093.

(Continued)

*Primary Examiner* — Herve-Louis Y Assouman
*Assistant Examiner* — Christopher M Roland
(74) *Attorney, Agent, or Firm* — MUGHAL GAUDRY & FRANKLIN PC

(57) ABSTRACT

A pocket integration for high density memory and logic applications and methods of fabrication are described. While various embodiments are described with reference to FeRAM, capacitive structures formed herein can be used for any application where a capacitor is desired. For example, (Continued)

the capacitive structure can be used for fabricating ferroelectric based or paraelectric based majority gate, minority gate, and/or threshold gate.

16 Claims, 23 Drawing Sheets

(51) Int. Cl.
H01L 49/02 (2006.01)
H03K 19/185 (2006.01)
H01L 23/532 (2006.01)
H01L 23/535 (2006.01)
H01L 21/768 (2006.01)
H01L 23/528 (2006.01)

(52) U.S. Cl.
CPC ...... *H01L 23/535* (2013.01); *H01L 23/53209* (2013.01); *H01L 23/53228* (2013.01); *H01L 23/53242* (2013.01); *H01L 23/53257* (2013.01); *H01L 28/55* (2013.01); *H01L 28/60* (2013.01); *H01L 28/65* (2013.01); *H03K 19/185* (2013.01); *H10B 53/10* (2023.02)

(58) Field of Classification Search
CPC ......... H01L 23/53228; H01L 23/53242; H01L 23/53257; H01L 23/535; H01L 28/60; H01L 28/65
See application file for complete search history.

(56) References Cited

U.S. PATENT DOCUMENTS

| | | | |
|---|---|---|---|
| 6,365,927 | B1 | 4/2002 | Cuchiaro et al. |
| 6,368,910 | B1 | 4/2002 | Sheu et al. |
| 6,548,343 | B1 | 4/2003 | Summerfelt et al. |
| 6,613,586 | B2 | 9/2003 | Bailey |
| 6,699,725 | B2 | 3/2004 | Lee |
| 6,753,193 | B2 | 6/2004 | Kim |
| 7,075,134 | B2 | 7/2006 | Araujo et al. |
| 7,754,501 | B2 | 7/2010 | Urushido |
| 7,977,720 | B2 | 7/2011 | Fukada |
| 8,440,508 | B2 | 5/2013 | Udayakumar et al. |
| 9,847,338 | B2 | 12/2017 | Nakao |
| 11,063,131 | B2 | 7/2021 | Haratipour et al. |
| 2002/0045279 | A1 | 4/2002 | Kwon et al. |
| 2003/0030084 | A1* | 2/2003 | Moise .............. H10B 53/30 257/295 |
| 2006/0133129 | A1 | 6/2006 | Rodriguez et al. |
| 2007/0045690 | A1* | 3/2007 | Fukada .............. H01L 21/76807 257/295 |
| 2008/0197502 | A1* | 8/2008 | Kikuchi .......... H01L 21/76832 257/E23.141 |
| 2010/0320518 | A1* | 12/2010 | Ozaki ............... H01L 28/60 257/295 |
| 2013/0264620 | A1* | 10/2013 | Yu .................. H01L 23/5329 438/653 |
| 2020/0395460 | A1 | 12/2020 | Haratipour et al. |
| 2021/0202510 | A1* | 7/2021 | Thareja ............ H01L 28/56 |
| 2023/0067555 | A1* | 3/2023 | Sato ............... H01L 21/76805 |
| 2023/0067612 | A1* | 3/2023 | Sato ............... H01L 23/5381 |
| 2023/0070073 | A1* | 3/2023 | Sato ................ H01L 28/65 |
| 2023/0073071 | A1* | 3/2023 | Sato ............... H01L 23/53209 |
| 2023/0077054 | A1* | 3/2023 | Sato ................ H01L 23/5381 |

FOREIGN PATENT DOCUMENTS

| | | |
|---|---|---|
| KR | 100481867 B1 | 4/2005 |
| KR | 100601953 B1 | 7/2006 |
| KR | 100791074 B1 | 1/2008 |
| KR | 100901950 B1 | 6/2009 |
| KR | 4428500 B2 | 3/2010 |
| WO | 2004076166 A2 | 9/2004 |

OTHER PUBLICATIONS

Chowdhury et al., "Alumina as a Hydrogen Barrier Layer for FeRAM Devices," 2007 Non-Volatile Memory Technology Symposium, 2007, pp. 49-52, doi: 10.1109/NVMT.2007.4389944.
Desu et al., "Reactive ion etching of ferroelectric SrBi2TaxNb2—xO9 thin films," Appl. Phys. Lett. 68, 566 (1996); https://doi.org/10.1063/1.116402. (3 pages).
Lee et al., "Plasma-Assisted Dry Etching of Ferroelectric Capacitor Modules and Application to a 32M Ferroelectric Random Access Memory Devices with Submicron Feature Size," Japanese Journal of Applied Physics, vol. 41, No. 11S, 2002. pp. 6749-6753. (5 pages).
Mauersberger et al., "Single-Step Reactive Ion Etching Process for Device integration of Hafnium-Zirconium-Oxide (HZO)/Titanium Nitride (TIN) Stacks." 2021 Semicond. Sci. Technol. 36 095025, https://doi.org/10.1088/1361-6641/ac1827 (7 pages).
News Release Jun. 22, 2021, "Perovskite memory devices with ultra-fast switching speed," Pohang University of Science & Technology (POSTECH), Downloaded on Oct. 19, 2021 from https://www.eurekalert.org/news-releases/603724. (2 pages).
Schneider et al., "Dry-etching of barium-strontium-titanate thin films," Proceedings of the 11th IEEE International Symposium on Applications of Ferroelectrics (Cat. No. 98CH36245) (pp. 51-54). IEEE. Aug. 1998. DOI: 10.1109/ISAF.1998.786634. (4 pages).
Shi et al., "Reactive ion etching of sol-gel-derived BST thin film," Ceramics International vol. 30, Iss. 7, 2004, pp. 1513-1516. (4 pages).
Ueda et al., "Plasma etching of PZT capacitor using ISM plasma source for ferroelectric memory application," Integrated Ferroelectrics, 39:1-4, 23-30, DOI: 10.1080/10584580108011924. (8 pages).
Walters, "Scaling and Design of Thin Film Ferroelectric Hafnium Oxide for Memory and Logic Devices," Dissertation for PhD Philosophy, University of Florida, 2020 (170 pages).
Wang et al., "Ferroelectric Devices and Circuits for Neuro-Inspired Computing," MRS Communications (2020), 10, 538-548, doi: 10.1557/mrc.2020.71, (11 pages).
Yeh et al., "Fabrication and Investigation of Three-Dimensional Ferroelectric Capacitors for the Application of FeRAM," AIP Advances, 6 035128(2016); doi: 10.1063/1.4945405. 13 pages.
Yu et al., "Atomic layer deposited ultrathin metal nitride barrier layers for ruthenium interconnect applications" Journal of Vacuum Science & Technology A 35, 03E109 (2017); https://doi.org/10.1116/1.4979709.
Non-Final Office Action notified dated Dec. 8, 2022 for U.S. Appl. No. 17/396,609.
Restriction Requirement notified dated Aug. 22, 2022 for U.S. Appl. No. 17/396,609.
Restriction Requirement notified dated Dec. 30, 2022 for U.S. Patent Application No. 17/465,92.
Final Office Action notified dated Apr. 6, 2023 for U.S. Appl. No. 17/396,609.
Non-Final Office Action notified dated Apr. 25, 2023 for U.S. Appl. No. 17/478,850.
Non-Final Office Action notified dated Mar. 31, 2023 for U.S. Appl. No. 17/478,849.
Notice of Allowance notified dated Jun. 15, 2023 for U.S. Appl. No. 17/396,609.
Restriction Requirement notified dated Apr. 26, 2023 for U.S. Appl. No. 17/550,899.
Restriction Requirement notified dated Apr. 26, 2023 for U.S. Appl. No. 17/552,266.
Restriction Requirement notified dated Apr. 26, 2023 for U.S. Appl. No. 17/552,321.

(56) References Cited

OTHER PUBLICATIONS

Restriction Requirement notified dated May 1, 2023 for U.S. Appl. No. 17/552,330.
Restriction Requirement notified dated May 1, 2023 for U.S. Appl. No. 17/552,345.
Office Action notified dated May 16, 2023 for Taiwan Patent Application No. 111132920.

* cited by examiner

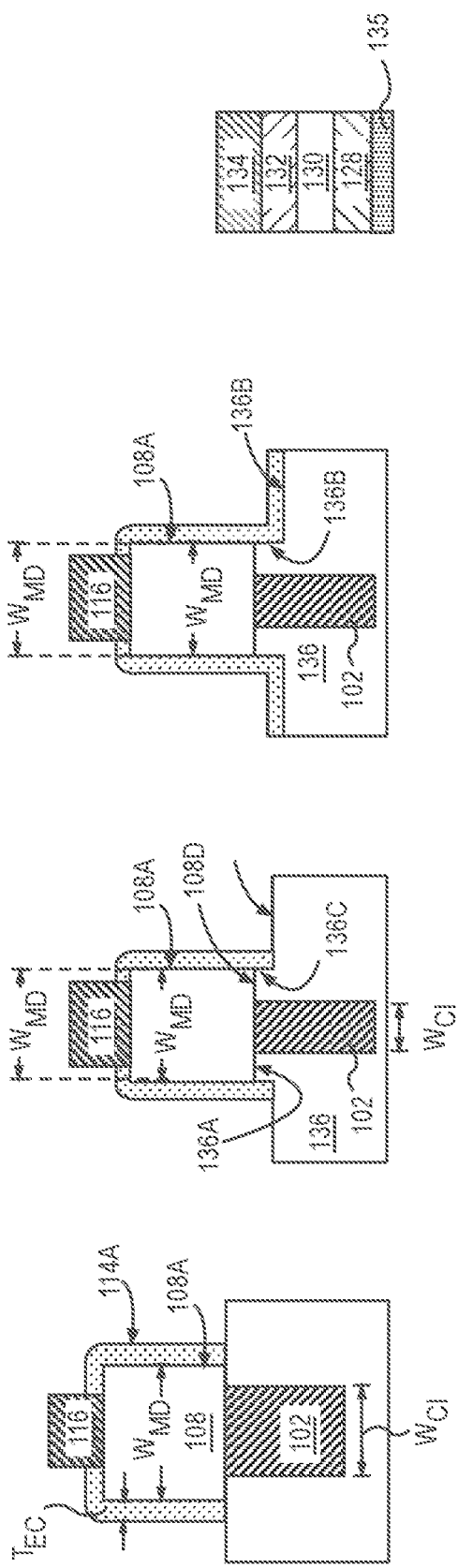

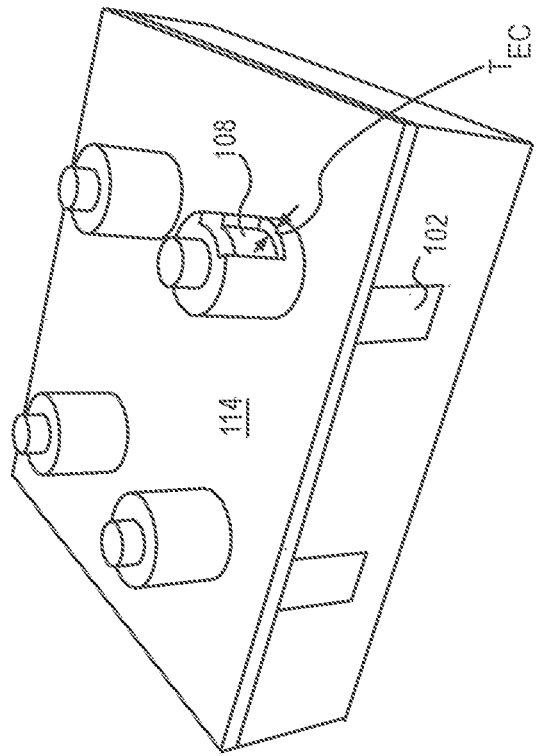
FIG. 3
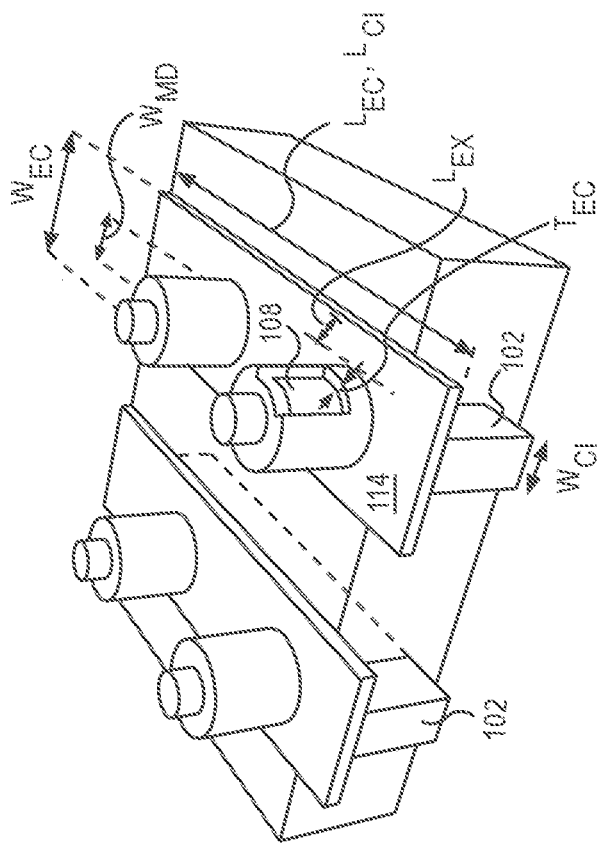
FIG. 2B

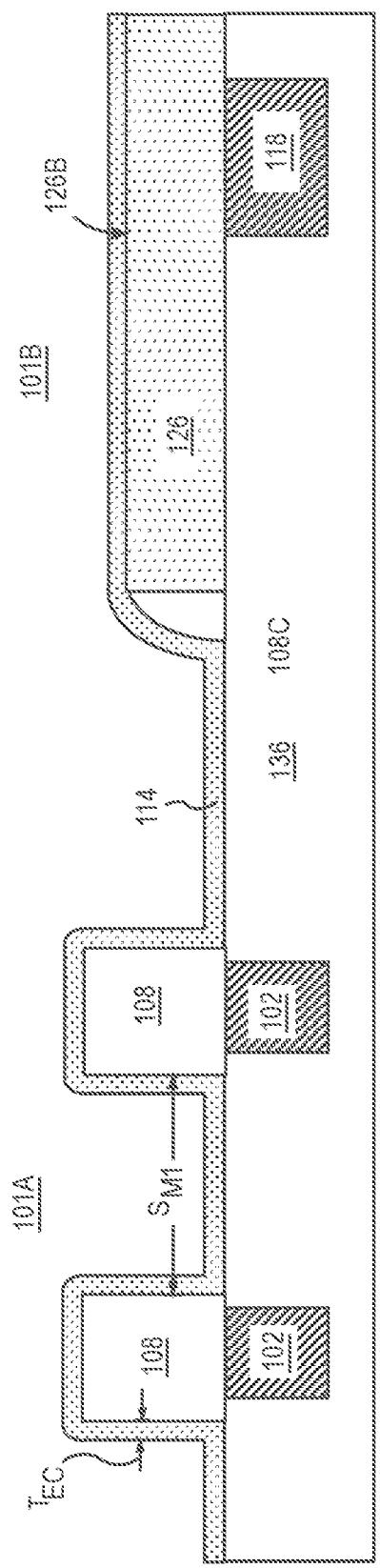
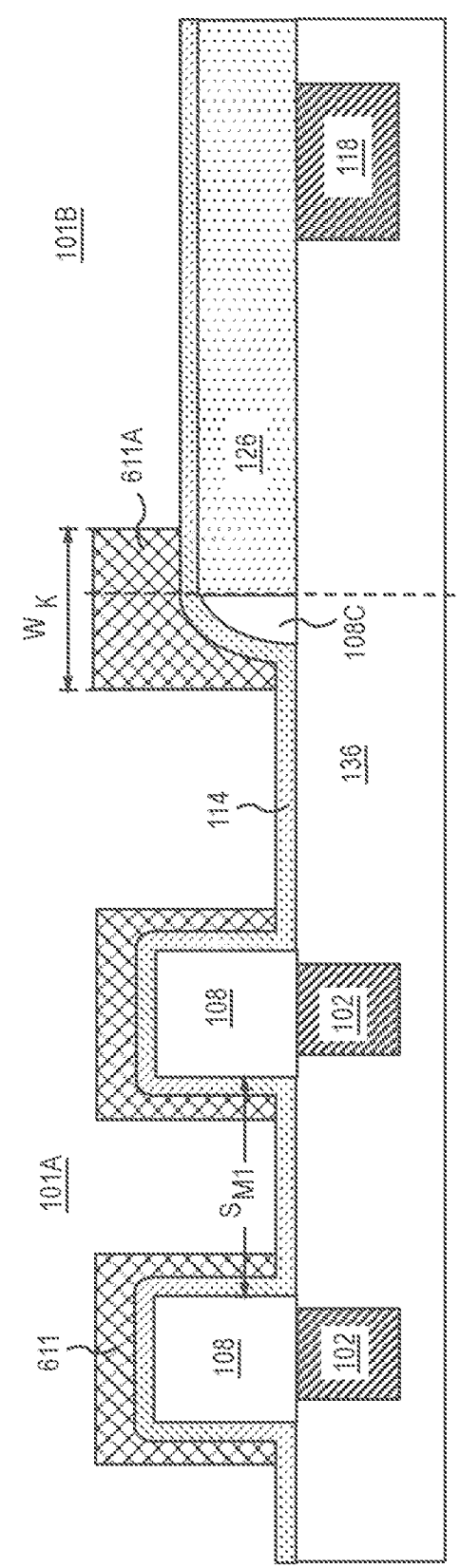
FIG. 6E
FIG. 6F

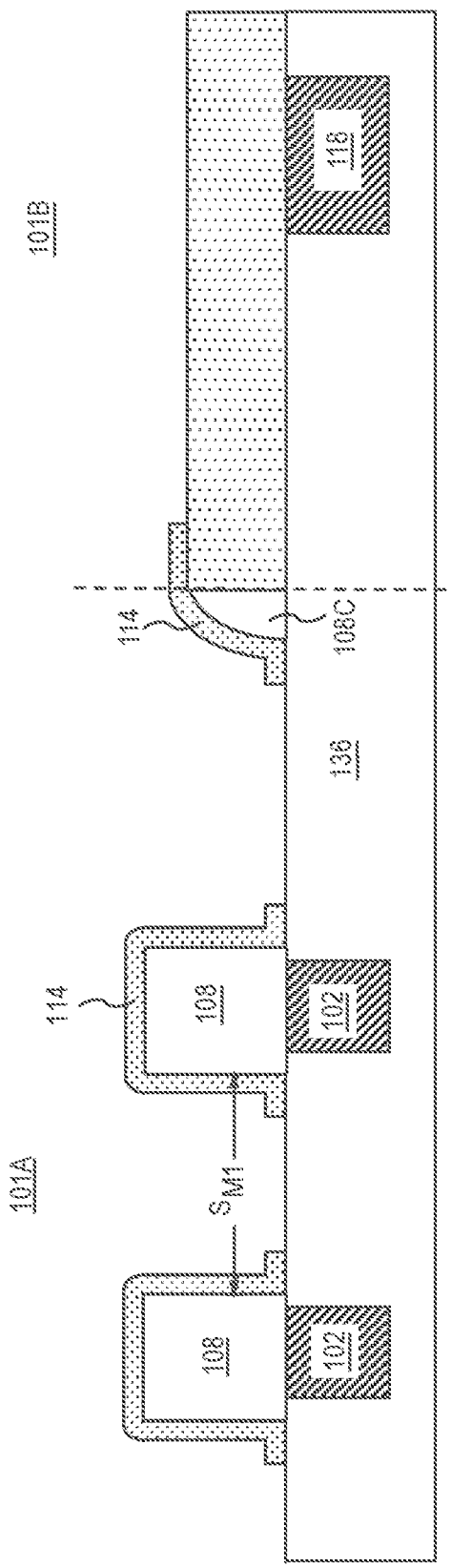
FIG. 7A
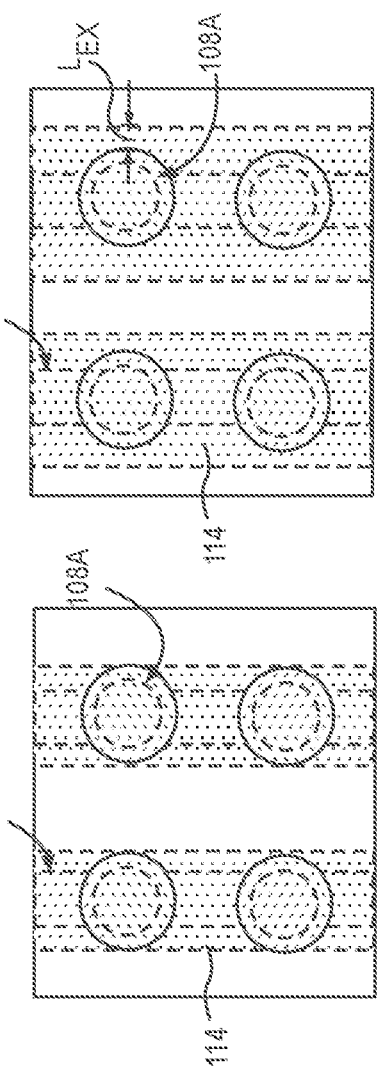
FIG. 7C
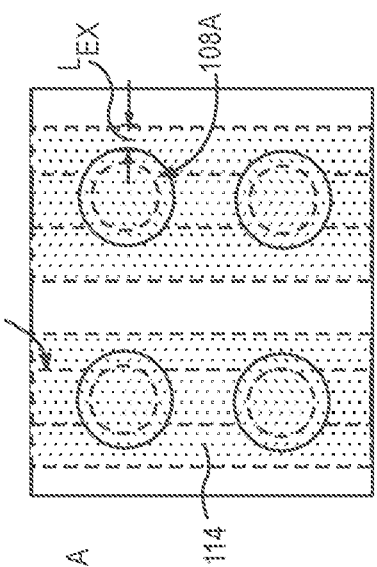
FIG. 7D
FIG. 7B

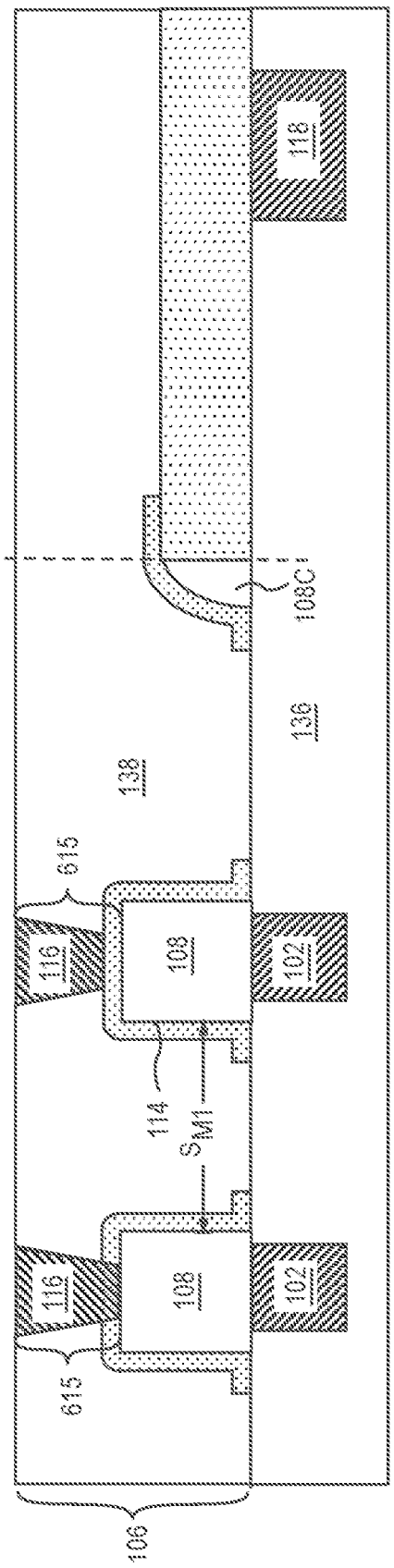
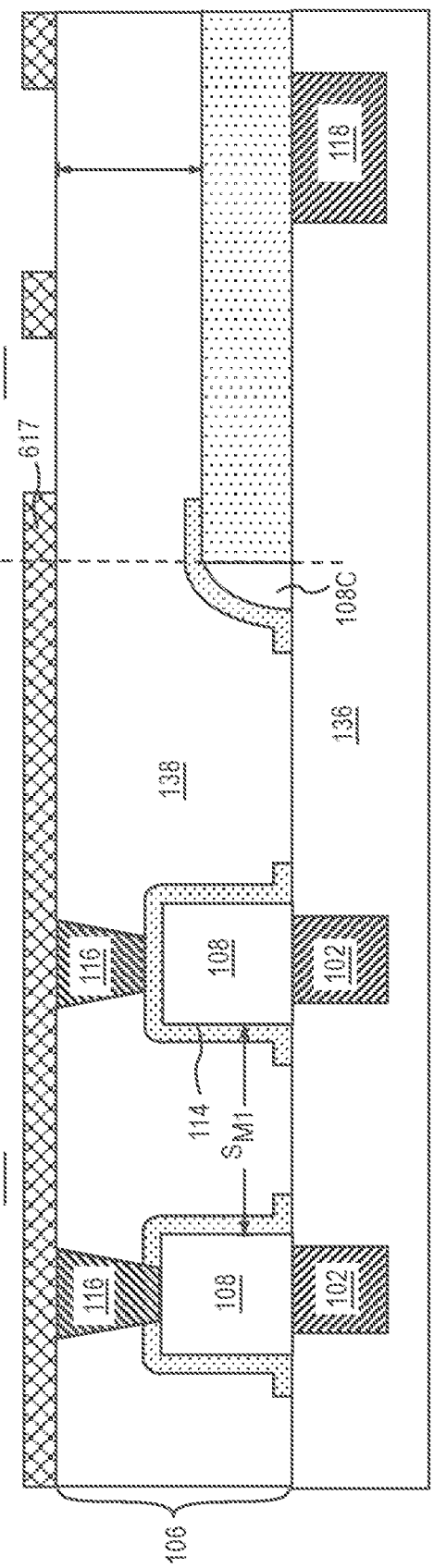
FIG. 8B
FIG. 8C

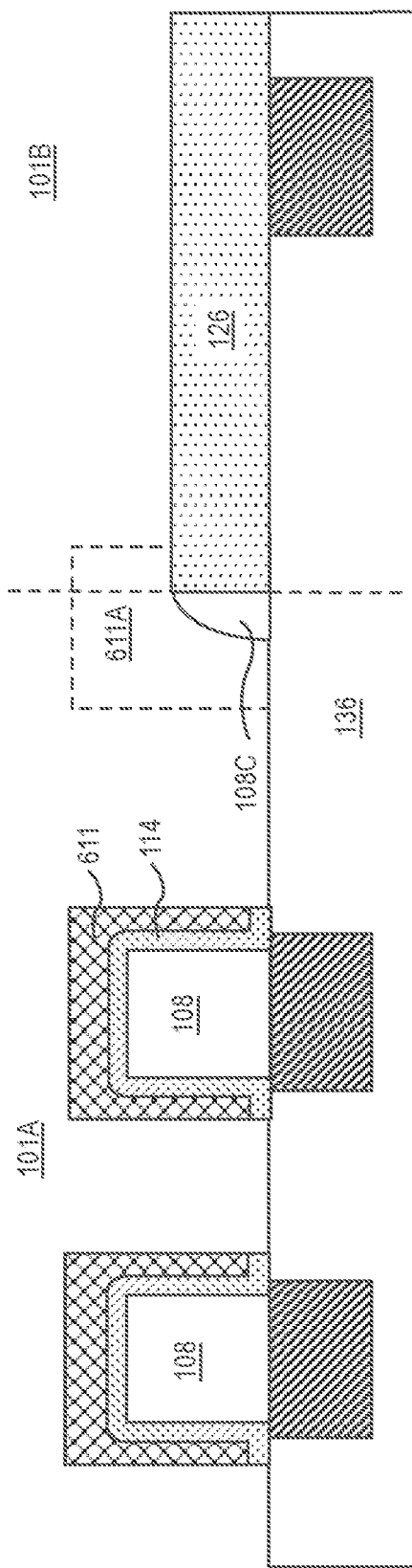
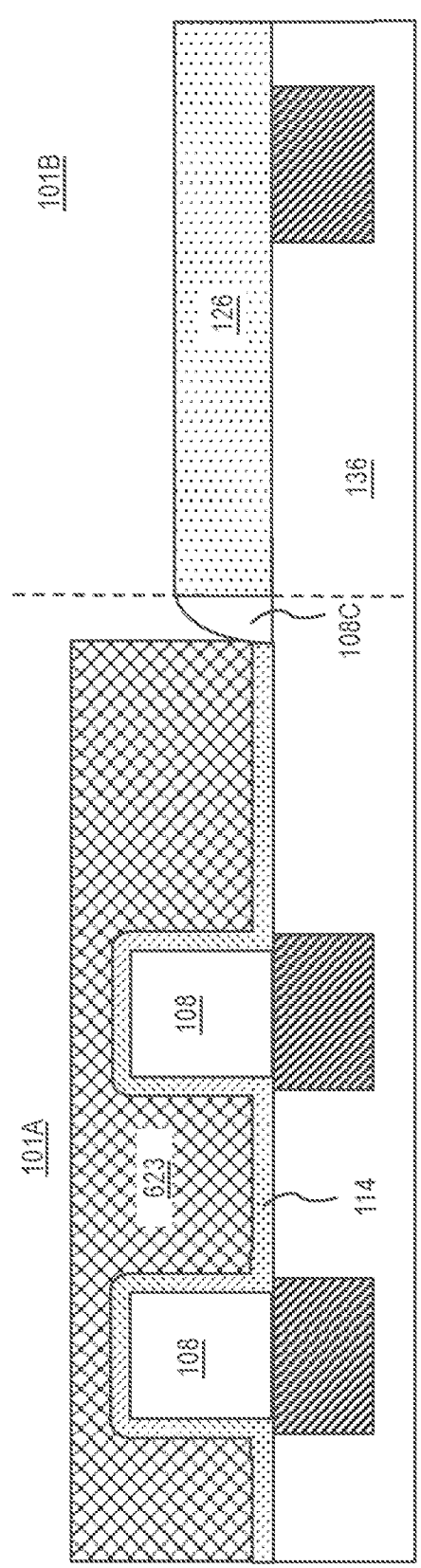
FIG. 9A
FIG. 9B

FERROELECTRIC MEMORY DEVICES

BACKGROUND

Integration of ferroelectric random-access memory (Fe-RAM) devices on a same plane as interconnects of logic devices can be challenging. FeRAM devices include materials that have a variety of thicknesses and be difficult to etch. Targeting a device thickness in a memory region with a height constraint of interconnects in an adjacent logic region is challenging. As such alternate methods to pattern and form devices that include ferroelectric materials is essential to realize a high-density array.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 2B is an isometric illustration of a plurality of ferroelectric memory devices in a memory region, where conductive interconnects in the memory region are trenches that couple more than one ferroelectric memory device, and where an encapsulation layer extends continuously between a pair of ferroelectric memory devices and over a respective trench connecting the pair of ferroelectric memory devices, in accordance with an embodiment of the present disclosure.

FIG. 3 is an isometric illustration of a plurality of ferroelectric memory devices in a memory region, where conductive interconnects in the memory region are trenches that couple more than one ferroelectric memory device, in accordance with an embodiment of the present disclosure.

FIG. 6E is a cross-sectional illustration of the structure in FIG. 6D following the process to deposit an encapsulation layer on the ferroelectric memory devices and on the electrode material.

FIG. 6F is a cross-sectional illustration of the structure in FIG. 6E following the process to form a block mask on the encapsulation layer to isolate each ferroelectric memory device.

FIG. 7A is a cross-sectional illustration of the structure in FIG. 6H following the process to etch the encapsulation layer.

FIG. 7B is a plan-view illustration of the structure in FIG. 7A, in an embodiment where conductive interconnects are discrete islands, and the block mask forms a substantially circular encapsulation layer around a sidewall of each ferroelectric memory devices.

FIG. 7C is a plan-view illustration of the structure in FIG. 7A, in an embodiment where the conductive interconnects are trenches and the mask forms an encapsulation layer around sidewall of each ferroelectric memory device.

FIG. 7D is a plan-view illustration of the structure in FIG. 7A, in an embodiment where the conductive interconnects are trenches and the mask forms an encapsulation layer around sidewall of each ferroelectric memory device.

FIG. 8B is a cross-sectional illustration of the structure in FIG. 8A following the process to remove the mask and deposit a conductive material to form via electrodes.

FIG. 8C is a cross-sectional illustration of the structure in FIG. 8B following the process to form a mask on the second dielectric, and on the via electrodes.

FIG. 9A is a cross-sectional illustration of the structure in FIG. 6F, following a process to etch the encapsulation layer to remove or reduce a thickness of a residue portion.

FIG. 9B is a cross-sectional illustration of the structure in FIG. 9A following a process to etch and remove the electrode material to form ferroelectric memory devices.

DETAILED DESCRIPTION

Figure 1A:
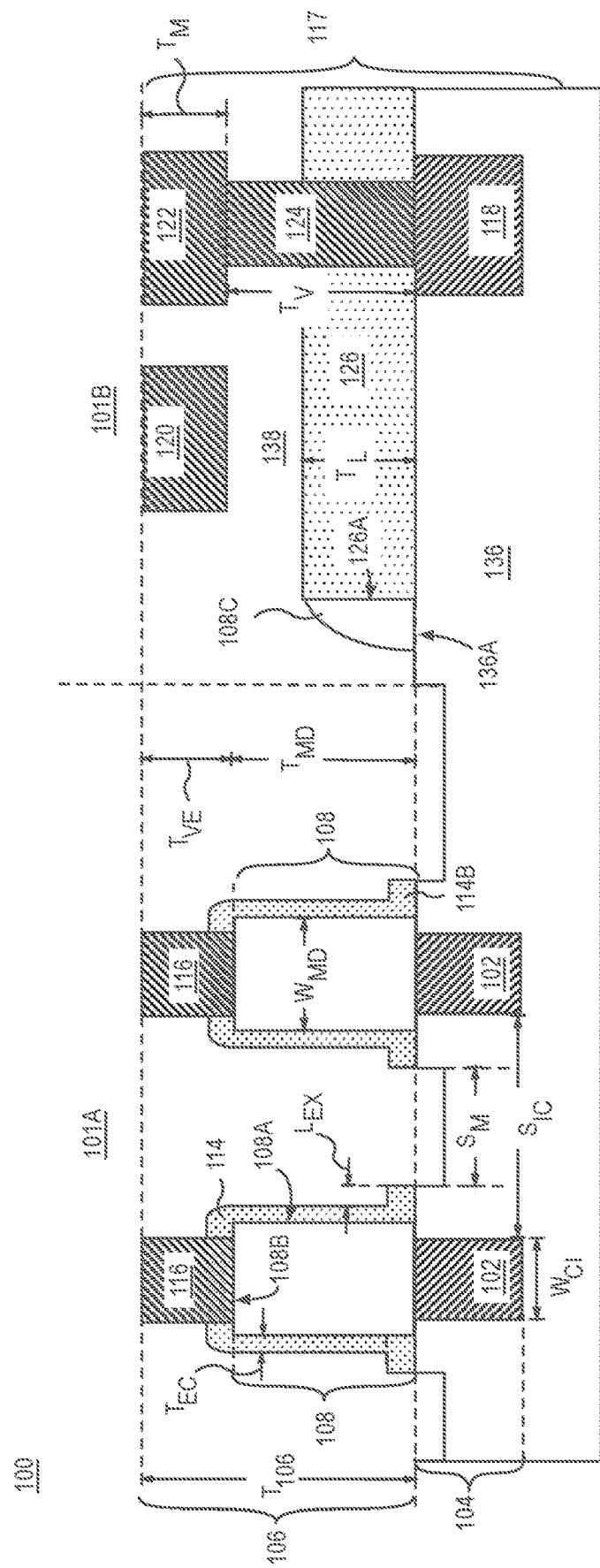
FIG. 1A is a cross-sectional illustration of a plurality of ferroelectric memory devices in a memory region adjacent to interconnect structures in a logic region, in accordance with an embodiment of the present disclosure.

Pocket integration process for embedded memory is described. While various embodiments are described with reference to FeRAM, capacitive structures formed herein can be used for any application where a capacitor is desired. For example, the capacitive structure can be used for fabricating ferroelectric based or paraelectric based majority gate, minority gate, and/or threshold gate. In the following description, numerous specific details are set forth, such as structural schemes and detailed fabrication methods to provide a thorough understanding of embodiments of the present disclosure. It will be apparent to one skilled in the art that embodiments of the present disclosure may be practiced without these specific details. In other instances, well-known features, such as process equipment and device operations, are described in lesser detail to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" means that a particular feature, structure, function, or characteristic described in connection with the embodiment, is included in at least one embodiment of the disclosure. The appearances of the phrase "in an embodiment" or "in one embodiment" in various places throughout this specification are not necessarily referring to the same embodiment of the disclosure. Furthermore, the particular features, structures, functions, or characteristics may be combined in any suitable manner in one or more embodiments. For example, a first embodiment, may be combined with a second embodiment, anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Perovskite FeRAM devices are advantageous for high density memory applications owing to their low power consumption and high on/off ratio. Perovskite FeRAM device are also desirable over other forms of memory such as magnetic tunnel junction-based devices due to the relatively low number of layers implemented for device functionality. A typical FeRAM may be fully operational with three layers, where a ferroelectric dielectric is contained between two electrode layers. The electrode layers may also include Perovskite materials to enable lattice matching and reduction in electrical resistance. Introduction of lead-free Perovskite materials offers additional environmental benefits without sacrificing device performance.

Ferroelectric capacitors may be integrated with transistors to form FeRAM devices. FeRAM devices may be directly adjacent to logic regions to enable system functionality. In particular, the ferroelectric capacitor may be formed on a level that is directly adjacent to routing interconnects of a logic region. The height of the level may be influenced by a total combined thickness of the vias and metal lines in the routing interconnects of the logic region. However, ferroelectric capacitors can span a total thickness that depends on thicknesses of individual layers in the memory devices, where the thickness can be equal to a thickness of one or more levels of the routing interconnects.

For manufacturability, a ferroelectric capacitor in a plurality of ferroelectric capacitors may be generally formed directly on a respective transition electrode. The transition electrode may be directly between the ferroelectric capacitor and a respective conductive interconnect that is coupled with a respective transistor on a lower level. A transition electrode is generally implemented because the conductive interconnect is fashioned from a material such as copper. The transition electrode can act as diffusion barrier, where the transition electrode can have a surface area that is greater than a surface area of the conductive interconnect to prevent copper from being exposed during formation of the ferroelectric capacitor.

However, a transition electrode may add to a total thickness of the ferroelectric capacitor. An increase in thickness can require additional levels of routing interconnects in the logic region. Additional layers can be detrimental in terms of cost as well as for electrical resistance. For example, in some cases, an increase in thickness of the ferroelectric capacitor is incrementally small, that more than a level of routing interconnects in the logic region may be required. In some such examples, a thickness of a via electrode coupled above the ferroelectric capacitor may need to be unnecessarily taller to span a total thickness of the more than a level of routing interconnects in the logic region. Increasing thickness of the via electrode can increase electrical line resistance in the ferroelectric capacitor.

However, to reduce a total height of the ferroelectric capacitor, the transition electrode may be removed. However, the relative area of a lowermost layer of the ferroelectric capacitor may be tuned relative to an area of a top surface of the conductive interconnect, depending on a material of the conductive interconnect. In examples where the conductive interconnect may include copper it is highly desirable that the ferroelectric capacitor have an area footprint where a perimeter of the area footprint overlaps a perimeter of the conductive interconnect. An overlap can prevent copper from being exposed while a patterning process is carried out to form the ferroelectric capacitor. In other examples, when the conductive interconnect includes a material other than copper the area footprint of the ferroelectric capacitor may be less than, equal to or greater than the area footprint of the conductive interconnect.

While the transition electrode may be removed in the memory region, in at least one embodiment, an insulator layer is implemented to facilitate formation of the transition electrode may remain in the logic region. The insulator layer may be in direct contact with the conductive interconnect in the logic region. The insulator layer may be advantageously implemented in the logic region to enable targeting of a known thickness of a dielectric material for patterning a via between a respective conductive interconnect and a metal line in the logic region.

The inventors have devised a method that provides for ferroelectric capacitor to be on the conductive interconnect in the memory region and an insulator layer to be exclusively in the logic region. The method further facilitates formation of a ferroelectric capacitor having a thickness that can be tuned to a desired thickness that is substantially within a level of the routing interconnect in the logic region. Additionally, the method permits implementation of an insulator layer with a substantially fixed thickness in the logic region. The method utilizes a multistep subtractive patterning process where a first operation forms a ferroelectric capacitor device, and a second operation forms the routing interconnect in the logic region. In an exemplary embodiment, the second process also includes patterning an encapsulation around the device.

To enable high density FeRAM devices the inventors have resorted to non lead-based Perovskite materials owing its environmental friendliness for mass production. A stack for ferroelectric capacitors can include one or more hardmask materials. The hardmask material can include dielectric materials, metallic materials or a combination thereof. Implementation of an etch with high selectivity (such as a reactive ion etching, or plasma etch process) between the hardmask and device layers can advantageously enable a total stack thickness that is less than a total thickness of layers within an adjacent conductive interconnect level.

In at least one embodiment, the conductive interconnects that are coupled with a respective ferroelectric capacitor are discrete island structures. In other embodiments, the conductive interconnect may be a continuous trench line, where a plurality of capacitors may be coupled with the trench line. In some such embodiments, the encapsulation layer may be continuous between a respective ferroelectric capacitor and extend along a length of the trench line. In further embodiments, the conductive interconnects are discrete, but a top electrode of individual ferroelectric capacitors are coupled together by a conductive plate. The conductive plate may be within the same level as the level of the routing interconnects.

Figure 1U:
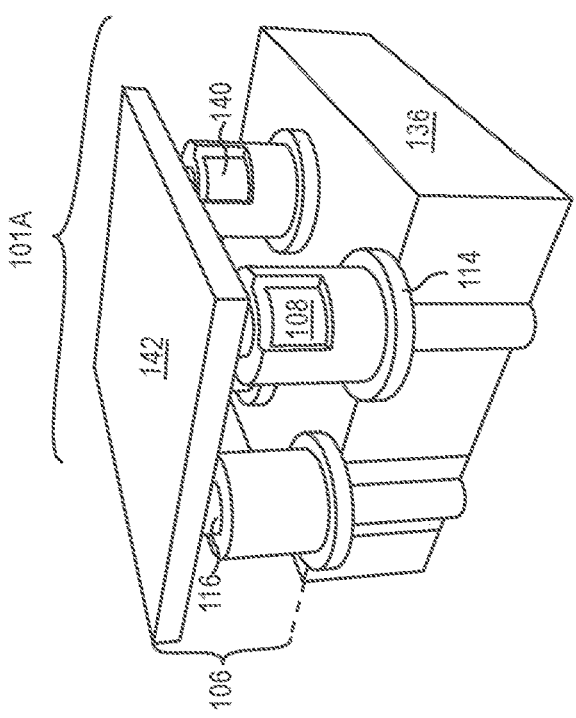
FIG. 1B is a cross-sectional illustration of a ferroelectric memory device above a transition electrode, where a lateral thickness of the transition electrode is equal to a lateral thickness of the ferroelectric memory device and two times a thickness of a spacer adjacent to the transition electrode, in accordance with an embodiment of the present disclosure.
FIG. 1C is a cross-sectional illustration of layers within a ferroelectric memory device that including a hardmask, in accordance with an embodiment of the present disclosure.
FIG. 1D is a cross-sectional illustration of a ferroelectric memory device that includes a conductive hardmask, in accordance with an embodiment of the present disclosure.
FIG. 1E is a cross-sectional illustration of a ferroelectric memory device that includes a dielectric hardmask, in accordance with an embodiment of the present disclosure.
FIG. 1F is a cross-sectional illustration of a ferroelectric memory device on a conductive interconnect, where the conductive interconnect has a greater lateral thickness than a lateral thickness of the ferroelectric memory device, in accordance with an embodiment of the present disclosure.
FIG. 1G is a cross-sectional illustration of a ferroelectric memory device that includes a hard mask including a dielectric material, in accordance with an embodiment of the present disclosure.
FIG. 1H is a cross-sectional illustration of a ferroelectric memory device that includes a dual hard mask that includes a layer of dielectric material on a layer of conductive material.
FIG. 1I is an isometric illustration of a plurality of ferroelectric memory devices in a memory region where a top electrode of individual ones of the plurality of ferroelectric memory devices are coupled to a common planar electrode, in accordance with an embodiment of the present disclosure.
FIG. 1J is an isometric illustration of a plurality of ferroelectric memory devices in a memory region adjacent to interconnect structures in a logic region, where conductive interconnects in the memory region are trenches that couple more than one ferroelectric memory device, in accordance with an embodiment of the present disclosure.

FIG. 1 is a cross-sectional illustration of a device structure 100, including a first region 101A, adjacent to a second region 101B. The region 101A and 101B may be for example a memory region and a logic region, respectively or vice versa. In at least one embodiment, region 101A is a memory region and region 101B is a logic region. The memory region 101A includes a plurality of conductive interconnects, such as interconnect 102 within level 104. The device structure 100 further includes a second level 106 above level 104. Level 106 may include memory devices. In at least one embodiment, level 106 includes a plurality of ferroelectric memory devices, such as ferroelectric memory device 108 above a respective conductive interconnect 102. To protect layers within the memory device 102 from degradation during a fabrication process, an encapsulation layer 114 is adjacent to sidewalls and on top surfaces of ferroelectric memory device 108. In at least one embodiment, encapsulation layer 114 is on sidewalls 108A and on top surface 108B of ferroelectric memory device 108.

The memory device 108 may be wider than or narrower than the conductive interconnect 102, depending on the material of the conductive interconnect 104. In at least one embodiment, ferroelectric memory device 108 is wider conductive interconnect 102 and can include a material such as copper or cobalt. The encapsulation layer 114 has a thickness, TEC, as measured from sidewall 108A. In at least one embodiment, the encapsulation layer 114 also extends laterally on a top surface 136A of a dielectric 136, beyond the thickness, TEC. Lateral extensions 114B may have a length, $L_{EX}$, as measured laterally from an outermost sidewall 114A of the encapsulation layer 114. The encapsulation layer 114 can laterally extend on a portion of an uppermost surface 136A of the dielectric 136 by a distance that is at least 25% of the thickness, $T_{EC}$, of the encapsulation layer 114. $L_{EX}$ may be between 2 nm and 10 nm. Lateral extensions 114B of the encapsulation layer 114 may not be symmetrical about the ferroelectric memory device 108.

In at least one embodiment, the encapsulation layer 114 has a thickness that is sufficiently large that the encapsulation layer 114 does not extend laterally beyond thickness, $T_{EC}$ as illustrated in FIG. 1B. In at least one embodiment, $T_{EC}$ can also vary as a function of height or vertical thickness, $T_{MD}$ of ferroelectric memory device 108. $T_{EC}$ may increase or decrease with $T_{MD}$.

In at least one embodiment, the encapsulation layer 114 illustrated in FIG. 1B can further extend below an upper most surface 136A of dielectric 136 or a lower most surface 108D of ferroelectric memory device 108 as shown in FIG. 1C. In some such embodiments, the dielectric 136 has an upper most surface 136A and a lower surface 136B below surface 136A. In at least one embodiment, lower surface 136B is substantially planar. Lower surface 136A may be sloped. As shown, when the dielectric includes a recessed surface 136B, the encapsulation layer 114 can further extend on second surface 136B as well as on a sidewall portion 136C. Sidewall portion 136C can be substantially aligned with sidewall 108A.

In other embodiments, the encapsulation layer 114 can also laterally extend onto lower surface 136B as shown in FIG. 1D. In embodiments, the dielectric 136 has one or more properties of dielectric 136, and encapsulation layer 114 has one or more properties of encapsulation layer 114 depicted in FIG. 1C. As shown in FIG. 1D, lateral extensions of encapsulation layer 114 can on a planar surface 136B. In other embodiments, the encapsulation layer 114 follows a surface topography of surface 136B of dielectric 136. The different surface topographies discussed above are a consequence of processing sequence utilized to fabricate ferroelectric memory device 108.

Referring again to FIG. 1A, level 106 also includes a via electrode 116 coupled with a respective ferroelectric memory device 108. As shown, memory device 108 has a vertical thickness $T_{MD}$, and via electrode 116 has a vertical thickness, $T_{VE}$. Level 106 has a vertical thickness, $T_{106}$ that is substantially equal to a combined sum of $T_{MD}$, and $T_{VE}$. Individual thicknesses $T_{MD}$, and $T_{VE}$ may be co-dependently chosen to optimize the ferroelectric memory device 108. For example, a thicker $T_{MD}$, corresponds to a thinner $T_{VE}$ and vice versa.

In at least one embodiment, the logic region 101B includes an interconnect structure 117 spanning levels 104 and 106. The interconnect structure 117 includes one or more conductive interconnects in level 104 and one or more vias and metal lines coupled with conductive interconnect 118 in level 106. In at least one embodiment, interconnect structure 117 includes a conductive interconnect 118 in level 104 and a plurality of metal lines 120 and 122, where metal line 122 is coupled with conductive interconnect 118 through a via 124. Metal line 122 may be coupled with a conductive interconnect through a via on a different plane, behind the plane of the illustration.

The via 124 has a vertical thickness, $T_V$, as measured from a lower most point of level 104 or from surface 118 of conductive interconnect 118, and metal line 122 has a vertical thickness, $T_M$. $T_{106}$ is also substantially equal to a combined sum of $T_M$, and $T_V$. In exemplary embodiments, a combined sum of $T_M$ and $T_V$ is equal to a combined sum of individual thicknesses $T_{MD}$, and $T_{VE}$. In general, $T_M$ and $T_{VE}$ need not be equal. $T_M$ can be greater than $T_{VE}$ or vice versa. In at least one embodiment, when $T_{MD}$ is less than $T_V$, $T_{VE}$ is greater than $T_M$. In at least one embodiment, $T_{VE}$ can be as much as 4 times greater than $T_M$, when $T_{MD}$ is less than 20 nm. In some such embodiments, $T_M$ can be between 20 nm and 50 nm.

In other embodiments, when $T_{MD}$ is greater than $T_V$, $T_{VE}$ is between 5% to 20% of $T_M$. For example, $T_{MD}$ can be as much as 100 nm. In other embodiments, $T_M$ can between 20 nm and 200 nm.

The logic region 101B also includes an etch stop layer 126 between the conductive interconnect 118 and metal line 122. In at least one embodiment, etch stop layer 126 spans the logic region 101B, and is directly on a portion of conductive interconnect 118. Via 124 is coupled with conductive interconnect 118 through etch stop layer 126. The etch stop layer 126 has a thickness, $T_L$. $T_L$ may be chosen based on a desired profile and thickness of via 124 as will be discussed below. The etch stop layer 126 includes a material that is different from a material of the encapsulation layer 114.

In at least one embodiment, a portion 108C (herein stack portion 108C), which includes one or more layers of ferroelectric memory device 108 is on dielectric 136, adjacent to the etch stop layer 126 as shown. Stack portion 108C may extend to various heights along sidewall 126A. The stack portion 108C may be an artifact of a processing methodology utilized to fabricate device structure 100. Other embodiments of device structure 100 may not include stack portion 108C.

In at least one embodiment, each ferroelectric memory device 108 within device structure 100 are substantially identical. While two ferroelectric memory device 108 are illustrated, an array can have more than 1000 substantially identical ferroelectric memory devices 108. Adjacent ferroelectric memory devices 108 may be laterally separated from each other by a distance, $S_M$. $S_M$ may range between 20 nm and 50 nm. The separation, $S_M$, is dependent on separation $S_{IC}$ between adjacent conductive interconnects 102 as well as on lateral thicknesses, $W_{CI}$ of the conductive interconnect 102, as will be discussed further below.

In embodiments, $S_M$ may depend on a stack of layers within the ferroelectric memory device 108. Depending on embodiments, the ferroelectric memory device 108 can have three or more layers. An embodiment of the ferroelectric memory device 108 including five layers is illustrated in FIG. 1E. As shown, ferroelectric memory device 108 includes a bottom electrode 128, a ferroelectric oxide layer 130 and a top electrode 132. In at least one embodiment, ferroelectric memory device 108 also includes an diffusion barrier layer 135. Diffusion barrier layer 135 may be implemented when the conductive interconnect 102 includes a material such as copper or cobalt. The diffusion barrier layer 135 may include a material such as but not limited to Al2O3, AlOx, HfOx, ZrOx, TaOx, TiOx, SiOx, SiN, SiCN, SiC, SiON, AlSiOx, HfSiOx, TaSiOx, TiON, TaON, AN, ZrN, HfN, TiAlN, TiAlO, TiAl, W, Ru, Jr, Mo, Ta, Zr, Hf, Nb.

In an embodiment, bottom electrode 128 and top electrode 132 include a conductive ferroelectric oxide. The conductive ferroelectric oxide includes one of a non-Pb perovskite metal oxides, such as but not limited to, La—Sr—CoO3, SrRuO3, La—Sr—MnO3, YBa2Cu3O7, Bi2Sr2CaCu2O8, or LaNiO3.

In an embodiment, the ferroelectric oxide layer 130 is a ferroelectric dielectric layer that includes non-Pb Perovskite material in the form $ABO_3$, where A and B are two cations of different sizes and O is Oxygen. A is generally larger than B in size. In at least one embodiment, non-Pb Perovskites can also be doped, e.g., by La or Lanthanides. The non-Pb Perovskite material can include one or more of La, Sr, Co, Cr, K, Nb, Na, Sr, Ru, Y, Fe, Ba, Hf, Zr, Cu, Ta, Bi, Ca, Ti, and Ni.

In other embodiments, ferroelectric dielectric layer includes low voltage ferroelectric material between the top electrode 132 and bottom electrode 128 These low voltage FE materials can be of the form $AA'BB'O_3$, where A' is a dopant for atomic site A and can be an element from the Lanthanides series, where B' is a dopant for atomic site B and can be an element from the transition metal elements such as Sc, Ti, V, Cr, Mn, Fe, Co, Ni, Cu, Zn. A' may have the same valency of site A, with a different ferroelectric polarizability. A voltage below X-Volts is sufficiently low to be characterized as low voltage.

The ferroelectric memory device 108 may also include a hardmask 134 as shown. In at least one embodiment, the hardmask 134 may be a dielectric hardmask 134, where the dielectric includes a material such as silicon and one or more of nitrogen, oxygen or carbon. In other embodiments, the hardmask includes a conductive material, for example, tantalum, titanium, ruthenium, or an alloy of nitrogen and one or more of tantalum, titanium, ruthenium. The combined thickness of the layers in the ferroelectric memory device 108 can range between 7 nm and 100 nm.

In at least one embodiment, where ferroelectric memory device 108 includes a hardmask 134, the material of hardmask 134 will determine whether via electrode 116 contacts hardmask 134 or extends through a portion of hardmask 134 and contacts top electrode 132. As shown in FIG. 1F, where hardmask 134 includes a conductive material, via electrode 116 is in contact with uppermost hardmask surface 134A. In other embodiments, where hardmask 134 includes a dielectric material, via electrode 116 extends through hardmask 134 and is in contact with uppermost surface 108B, as shown in FIG. 1G.

In a further embodiment, ferroelectric memory device 108 includes a dual hard mask where hardmask 134 is a dielectric and a hardmask 144 that includes a conductive material, as shown in FIG. 1H. A dual hardmask including hardmask 144 may be advantageous when the ferroelectric memory device 108 has a thickness $T_{MD}$ that is substantially less than $T_V$ (thickness of via 124). For example, in at least one embodiment, $T_{MD}$ is between 10 nm and 30 nm and $T_V$ is as much as 100 nm, where the ratio between 1:3 to 1:10. In some such embodiments, conductive hardmask 144 compensates for shorter height of ferroelectric memory device 108.

Referring again to FIG. 1A, conductive interconnect 118 has one or more properties of conductive interconnect 102. Conductive interconnects 102 and 118 include a material such a copper or tungsten. Conductive interconnects 102 and 118 have a thickness that spans a portion of dielectric 136 within level 104. There may be other vias and interconnect routing connections within level 104 that are not shown in the Figure. In an embodiment, via electrode 116, via 124, metal lines 120 and 122, include a same or substantially the same material. In at least one embodiment, via electrode 116, via 124, metal lines 120 and 122, include a same or substantially the same material as the material of the conductive interconnect 102.

In different embodiments, via electrode 116, via 124, conductive interconnects 102 and 118 can be discrete vias or continuous trenches.

In accordance with an embodiment of the present disclosure, FIG. 1I is an isometric illustration of the device structure 100 in FIG. 1A, where the conductive interconnect 102 are discrete islands. As shown, the memory region 101A in device structure 100 further includes a plurality of memory devices such as ferroelectric memory device 140 (illustrated through a cut out in encapsulation layer 114). The ferroelectric memory devices 140 are on a plane 141, behind ferroelectric memory devices 108. The ferroelectric memory devices 140 are substantially identical to and have all of the properties of the ferroelectric memory device 108. In at least one embodiment, the respective ferroelectric memory device 108 or ferroelectric memory device 140 have a cylindrical shape. In at least one embodiment, each ferroelectric memory device 140 is coupled with a conductive interconnect 102 that is a discrete island. The ferroelectric devices 140 maybe spaced apart from ferroelectric devices 108 by a distance, $S_{M2}$. In at least one embodiment, a discrete via electrode 116 is coupled with a respective ferroelectric memory device 108 or ferroelectric memory device 140.

The ferroelectric memory device 108 can have a width, $W_{MD}$, that is less or greater than a width, $W_{CI}$, of the conductive interconnect 102. In one embodiment, Wo is less than $W_{MD}$, when conductive interconnect includes, for example copper. In another embodiment, Wo is greater than $W_{MD}$, (for example 102 in dashed lines in the figure) when conductive interconnect includes, for example a conductive material other than copper.

In at least one embodiment, the conductive interconnect 118 is a conductive trench interconnect 118 and extends along the y-direction. As shown, metal lines 120 and 122 also extend along the y-direction. In at least one embodiment, via 124 may be the only conductive via between metal line 122 and conductive interconnect 118. In other embodiments, interconnect structure 117 can include a plurality of vias such as via 124 between metal line 122 and conductive interconnect 118 to prevent an increase in line resistance.

In at least one embodiment, stack portion 108C extends along the y-direction, parallel to the metal lines 120 and 122.

In at least one embodiment, the via electrode 116 coupled with each ferroelectric memory device 108 and 140 may be further coupled together by a common plate electrode 142, such as is shown in the cross-sectional illustration of FIG. 1J. The logic region 101B is not illustrated for clarity. In one such embodiment, the plate electrode 142 may extend over and be coupled with a top of all memory devices such as ferroelectric memory devices 108 and 140, through a respective via electrode 116. In embodiments, the plate electrode 142 is within the second level 106.

Figure 2A:
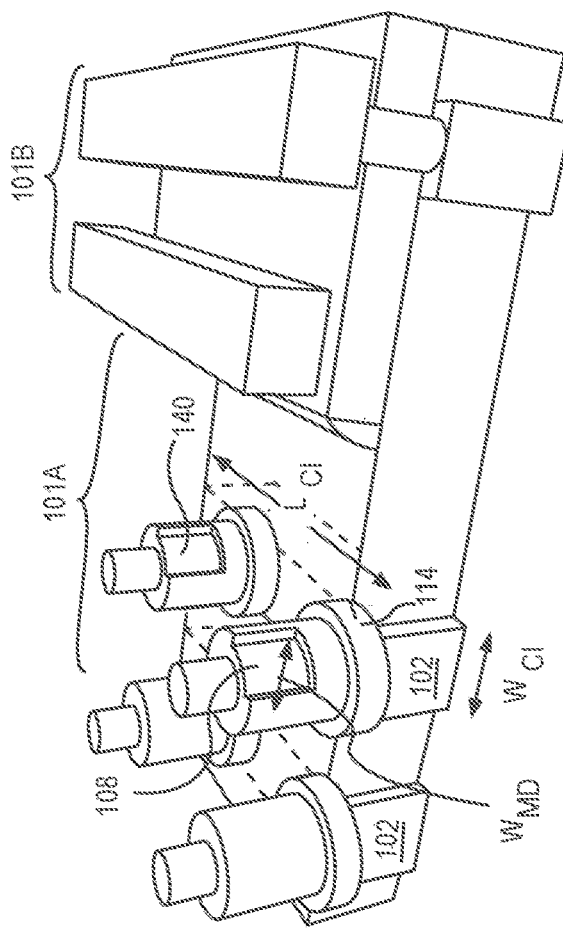
FIG. 2A is an isometric illustration of a plurality of ferroelectric memory devices in a memory region, where conductive interconnects in the memory region are trenches that couple more than one ferroelectric memory device, in accordance with an embodiment of the present disclosure.

In at least one embodiment, the conductive interconnect 102 includes a material other than copper, such as tungsten, ruthenium, titanium, tantalum, and/or nitrides of tungsten, ruthenium, titanium or tantalum. In some such embodiments, conductive interconnect 102 can be equal to or wider than the ferroelectric memory device 108, as shown in FIG. 2A. In one such embodiments the conductive interconnect 102 continuously extends along a longitudinal direction, such as for example, from ferroelectric memory device 108 to ferroelectric memory device 140, as shown. In at least one embodiment, the ferroelectric memory device 108 has a width, $W_{MD}$, that is less than a width, $W_{CI}$, of the conductive interconnect 102 along the length Lo.

In at least one embodiment, where ferroelectric memory device 108 extends over a portion of, but not completely over conductive interconnect 102, in one or both x and y directions, encapsulation layer 114 can also extend over conductive interconnect 102 along one or both directions as shown in FIG. 2A. In at least one embodiment, encapsulation layer 114 is over and adjacent to each ferroelectric memory device 108 and 140.

In at least one embodiment, where conductive interconnect 102 extends along the y-direction but includes a material other than copper, the encapsulation layer 114 can also extend continuously along the y-direction as illustrated in FIG. 2B. The logic region 101B is omitted for clarity. In some such embodiments, the ferroelectric memory device 108 can have a width, $W_{MD}$, that is greater or less than a width, $W_{CI}$, of the conductive interconnect 102. In at least one embodiment, $W_{MD}$ is greater than a width, $W_{CI}$, of the conductive interconnect 102.

In further some such embodiments, encapsulation layer 114 has a lateral thickness WEE, that is at least equal to or greater that $W_{CI}$, and a length, $L_{EC}$, that extends along the y-direction. The encapsulation layer 114 can provide protection against oxidation of an uppermost surface of the conductive interconnect 102.

In at least one embodiment, the respective ferroelectric memory device 108 or ferroelectric memory device 140 have a cylindrical shape. In some such embodiments $W_{MD}$, is a diameter the respective ferroelectric memory device 108 or ferroelectric memory device 140.

In other embodiments, the encapsulation layer 114 is continuous between adjacent ferroelectric memory devices 108, between adjacent ferroelectric memory devices 140, and between ferroelectric memory device 108 and 140, as shown in FIG. 3. In some such embodiments, encapsulation layer 114 can also extend on etch stop layer 126.

Figure 4:
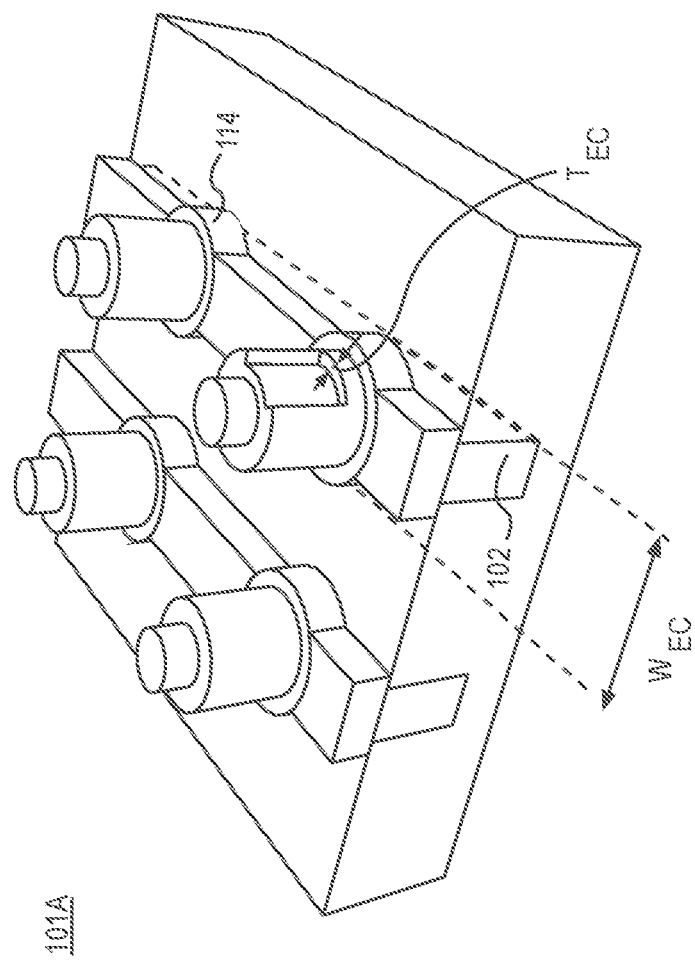
FIG. 4 is an isometric illustration of a plurality of ferroelectric memory devices in a memory region, where conductive interconnects in the memory region are trenches that couple more than one ferroelectric memory device, in accordance with an embodiment of the present disclosure.

FIG. 4A is an embodiment of the structure in FIG. 2A, where the encapsulation layer 114 has a lateral extension that extends beyond a thickness, $T_{EC}$, of the encapsulation layer 114, but the lateral thickness, or width, $W_{EC}$, vary along the y-direction.

Figure 5:
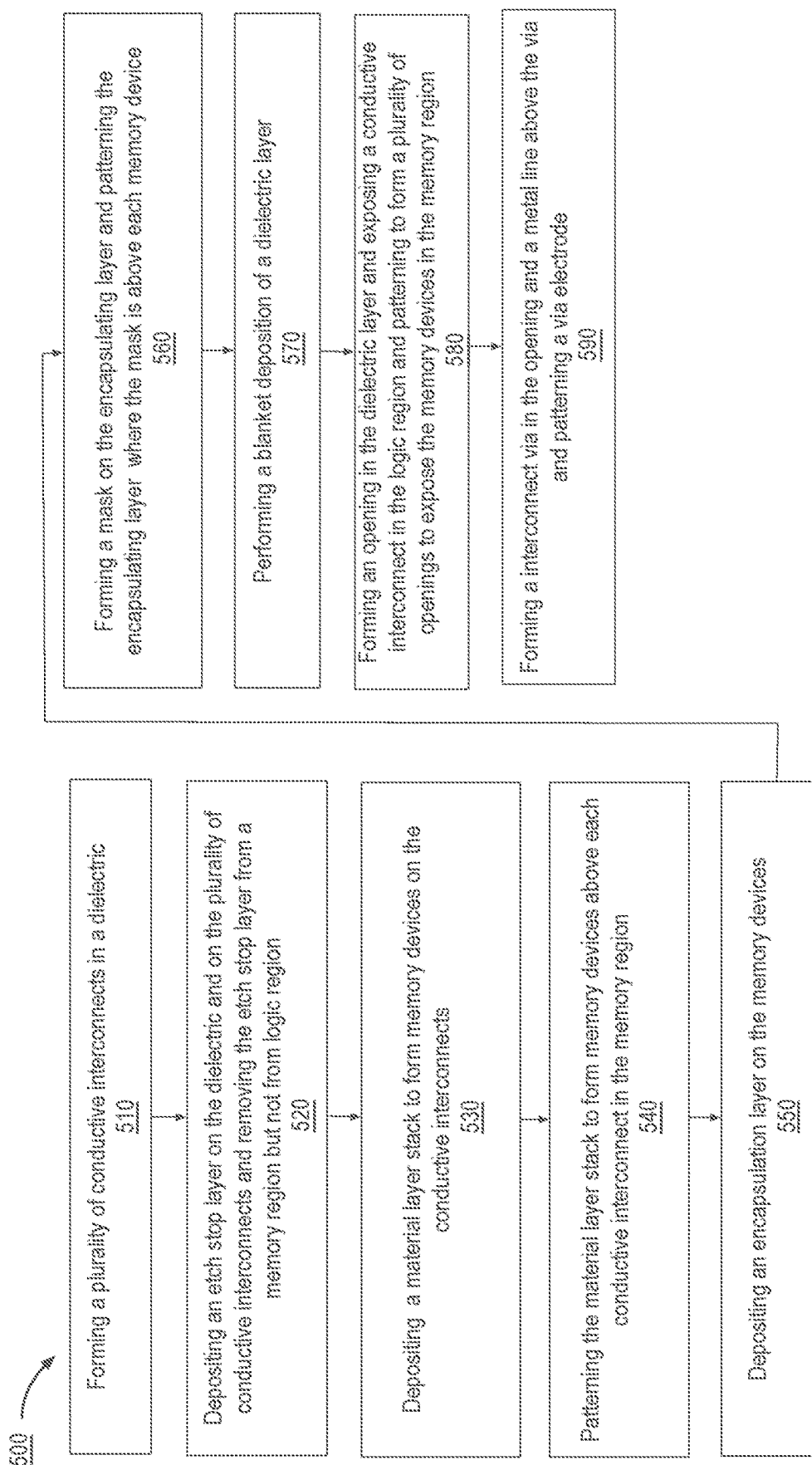
FIG. 5 is a flow diagram of a method to fabricate a ferroelectric memory device adjacent to interconnects in a logic region, in accordance with an embodiment of the present disclosure.

FIG. 5 is a flow diagram to form a plurality of ferroelectric memory devices in a memory region and conductive interconnects in a logic region, in accordance with an embodiment of the present disclosure. The method begins at operation 510, with the formation of plurality of conductive interconnects in a dielectric. The method 500 continues at operation 520 with the deposition of an etch stop layer on the dielectric and on the plurality of conductive interconnects and removing the etch stop layer from a memory region but not from a logic region. The method continues at operation 530 with the deposition of a deposition of a material layer stack to form memory devices on the electrode material. The method continues at operation 540 with the process to pattern the material layers stack to for memory devices above each conductive interconnect in the memory region. The method continues at operation 550 with the deposition of an encapsulation layer on the memory devices. The method continues at operation 560 with the formation of a mask on the encapsulating layer and patterning the encapsulating layer and electrode material, where the mask is above each memory device. The method continues at operation 570 with a blanket deposition of a dielectric layer. The method continues at operation 580 with the formation of one or more openings in the dielectric layer and exposing one or more conductive interconnects in the logic region. The method concludes at operation 590 with the formation of one or more interconnect vias in the one or more openings and a metal line on a respective interconnect via.

Figure 6A:
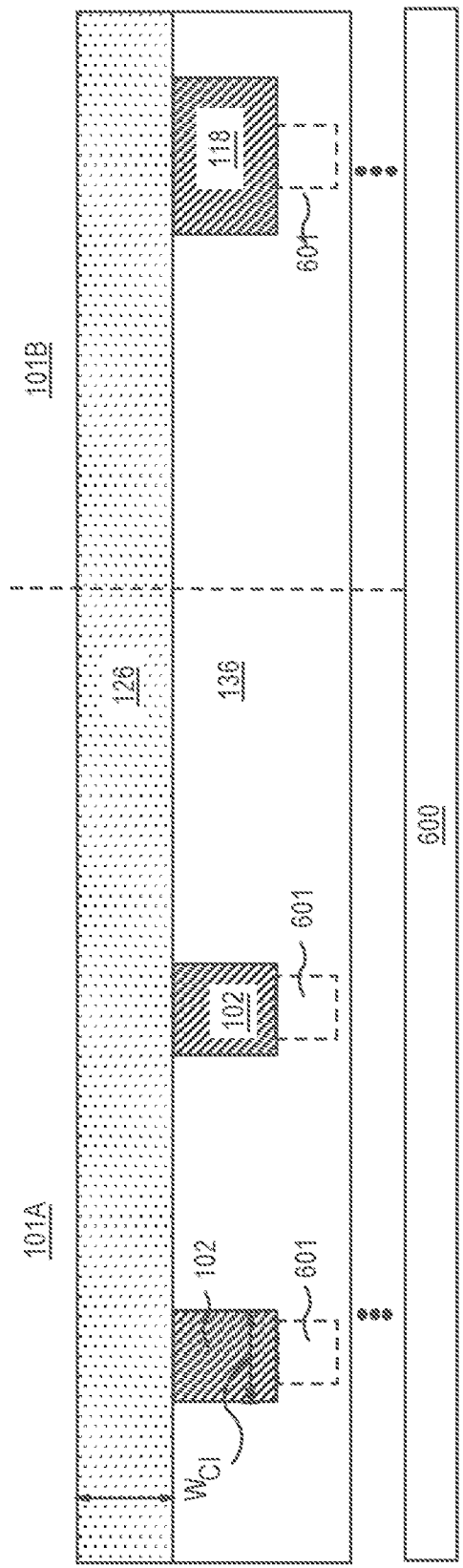
FIG. 6A is a cross-sectional illustration of a plurality of conductive interconnects formed within a first dielectric in a memory region and in a logic region above a substrate and following the formation of an etch stop layer on the conductive interconnects.

FIG. 6A is a cross-sectional illustration of a plurality of conductive interconnects 102 and 118 formed within a dielectric 136 above a substrate 600. In at least one embodiment, conductive interconnects 102, are formed in a memory region and metallization structure 118 is formed in a logic region. In exemplary embodiments, there may be one or more levels of transistors and interconnects between the conductive interconnects 102 and 118 and the substrate 600. In high density memory applications, the number of conductive interconnects can range between 1K and 5K within a given array in the memory region 101A. The conductive interconnects 102 and 118 have a lateral thickness, $W_{CI}$, that may be determined by a minimum acceptable electrical resistance. In at least one embodiment, the conductive interconnects 102 are discrete structures that are substantially circular or elliptical in shape and conductive interconnect 118 is a trench line. The conductive interconnects 102 may have a maximum lateral thickness between 20 nm and 40 nm. For example, the conductive interconnects 102 may have a lateral thickness between 20 nm and 40 nm, along the x-direction, as shown. In other embodiments, each conductive interconnects 102 and 118 is a line that extends into the plane of the Figure. As shown conductive interconnects 102 and 118 have substantially the same lateral thickness to minimize variability in device performance.

In at least one embodiment, the conductive interconnects 102 and 118 are electrically and mechanically coupled with vias and/or lines such as via 601 and/or line 601 indicated in dashed boxes in the Figure. The via 601 and/or line 601 may include a same or substantially the same material as a material of the conductive interconnect 102.

In one or more embodiments, conductive interconnects 102 and 118 include copper. In at least one embodiment, conductive interconnects 102 and 118 include a liner layer and a fill metal on the liner layer. For example, the liner layer may include a material, such as but not limited to, ruthenium, cobalt or tantalum and the fill metal may include copper or tungsten. In an embodiment, each of the conductive interconnects 102 are separated by spacing $S_{IC}$. $S_{IC}$ is substantially determined by a designed density of ferroelectric memory devices to be fabricated within a given area, as well as by underlying structures embedded within layers below the conductive interconnects 102.

In an embodiment, an encapsulation layer 126 is deposited on the conductive interconnects 102 and 118 as well as on the dielectric layer 204. The encapsulation layer 126 is deposited to a thickness that is chosen to accommodate a height of a via to be formed, as well as to target an etch in the logic region 101B in a downstream operation. In an embodiment, the encapsulation layer 126 also serves as a diffusion barrier layer. A diffusion barrier layer is essential for preventing diffusion of copper from the conductive interconnect 118 to the ferroelectric memory devices to be formed. As such, the encapsulation layer 126 includes material such as but not limited to silicon and one or more of nitrogen, oxygen, or carbon.

Figure 6B:
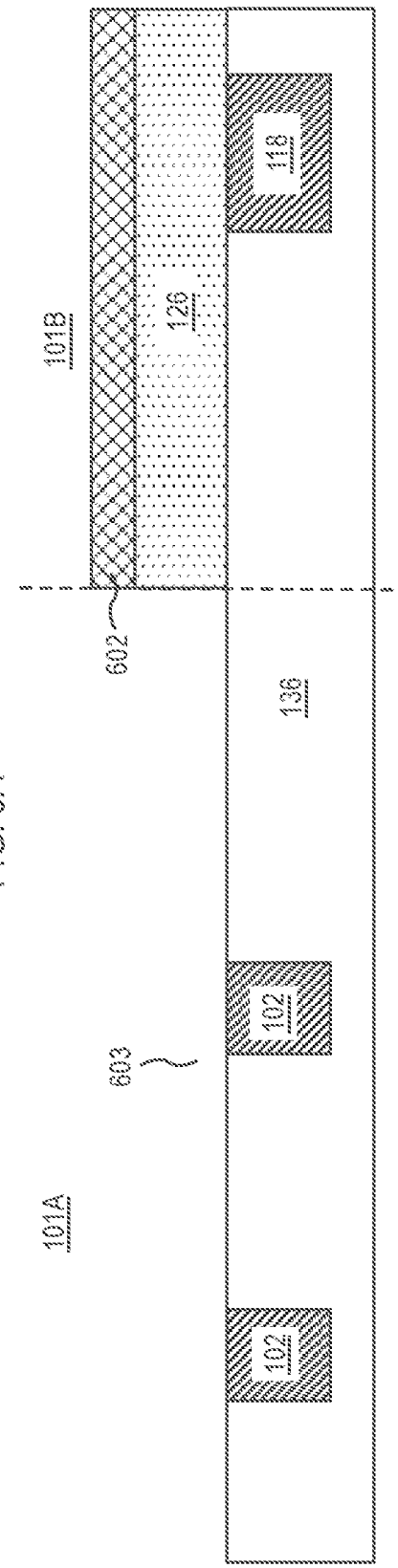
FIG. 6B is a cross-sectional illustration of the structure in FIG. 6A following the process to etch a portion of an etch stop layer 126 from a memory region

FIG. 6B is a cross-sectional illustration of the structure in FIG. 6A following the process to etch a portion of the etch stop layer 126 from a memory region. In an embodiment, a photoresist mask 602 is formed by a lithographic technique on the encapsulation layer 126. Exposed portions of the encapsulation layer 126 may be etched by a plasma etch process through opening in the photoresist mask 602. The etch process isolates the encapsulation layer 126 to the logic region 101B and exposes the dielectric 136 and conductive interconnects 102 in the memory region. The substrate 600 is not illustrated in FIGS. 6B-9B, for clarity.

Figure 6C:
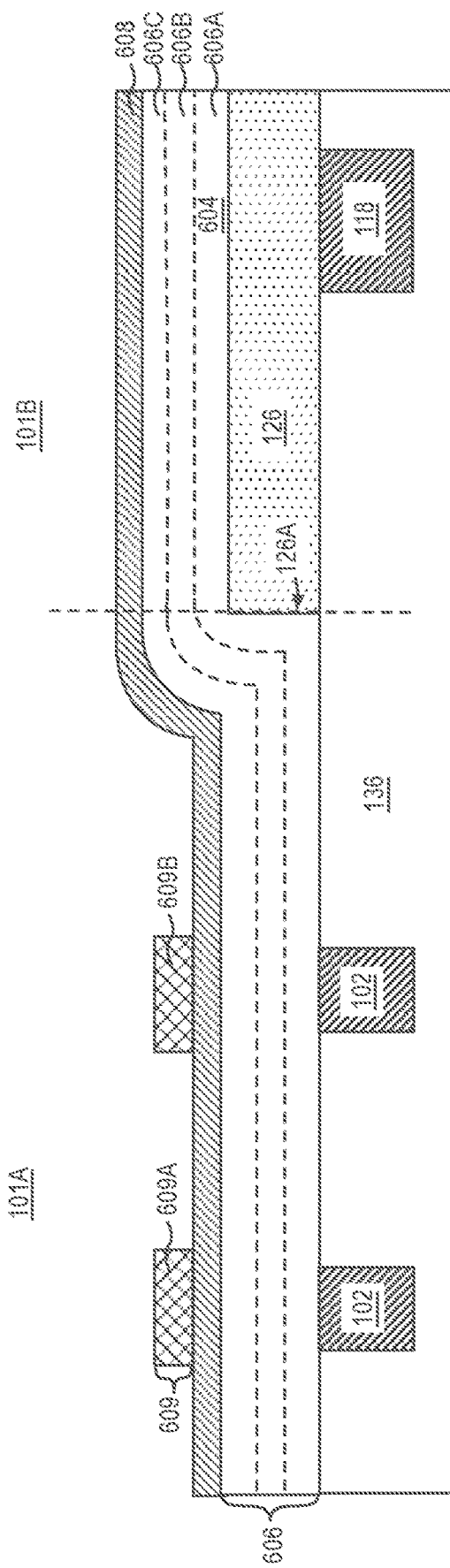
FIG. 6C is a cross-sectional illustration of the structure in FIG. 6B following the process to deposit an electrode material on the conductive interconnects in the memory region, on a first dielectric and on the etch stop layer and following the formation of a material layer stack to form ferroelectric memory devices.

FIG. 6C is a cross-sectional illustration of the structure in FIG. 6B following the process of blanket deposition of a material layer stack 606 for the formation of a memory device on the conductive interconnects 102 and 118, and on the dielectric 136 followed by deposition of a hardmask layer 608 on the material layer stack 606 and formation of a mask 609 on the hardmask layer 608, in accordance with an embodiment of the present disclosure. In an exemplary embodiment, etch stop layer 126 and all layers of the material layer stack 606 are deposited in situ, e.g., without breaking vacuum. The material layer stack 606 maybe deposited by an atomic layer deposition (ALD) process, a plasma enhanced chemical vapor deposition (PECVD), chemical vapor deposition (CVD) or a physical vapor deposition (PVD) process. In at least one embodiment, a conductive layer 606A is blanket deposited on the electrode material 604. In an exemplary embodiment, conductive layer 606A includes a conductive ferroelectric oxide. The conductive ferroelectric oxide includes one of a non-Pb perovskite metal oxides, such as but not limited to, La—Sr—CoO3, SrRuO3, La—Sr—MnO3, YBa2Cu3O7, Bi2Sr2CaCu2O8, or LaNiO3.

The conductive layer 606A is deposited to a thickness, Ti, that is suitable for minimizing electrical resistance and flare in sidewalls during a patterning process to be utilized to fabricate ferroelectric memory devices. In at least one embodiment, the conductive layer 606A has a thickness that is between 3 nm and 30 nm. A thickness of less than 30 nm is highly desirable to prevent significant tapering in sidewalls during the patterning process.

The deposition process is continued by deposition of a ferroelectric dielectric layer 606B. In an exemplary embodiment the ferroelectric dielectric layer 606B is blanket deposited on the conductive layer 606A. The ferroelectric dielectric layer 606B has a thickness, $T_2$, that is between 1 nm and 30 nm. In at least one embodiment, ferroelectric dielectric layer 606B includes non-Pb Perovskite material in the form $ABO_3$, where A and B are two cations of different sizes and O is Oxygen. A is generally larger than B in size. In at least one embodiment, non-Pb Perovskites can also be doped, e.g., by La or Lanthanides. The non-Pb Perovskite material can include one or more of La, Sr, Co, Cr, K, Nb, Na, Sr, Ru, Y, Fe, Ba, Hf, Zr, Cu, Ta, Bi, Ca, Ti and Ni.

In other embodiments, ferroelectric dielectric layer 606B includes low voltage ferroelectric material between the conductive oxide layers (606A and 606B). Low voltage materials can be of the form $AA'BB'O_3$, where A' is a dopant for atomic site A and can be an element from the Lanthanides series and B' is a dopant for atomic site B and can be an element from the transition metal elements such as Sc, Ti, V, Cr, Mn, Fe, Co, Ni, Cu, Zn. A' may have the same valency of site A, with a different ferroelectric polarizability. A voltage below 3 Volts is sufficiently low to be characterized as low voltage.

The deposition process is continued with a deposition of a conductive layer 606C on the ferroelectric dielectric layer 606B. In an exemplary embodiment, the conductive layer 606C includes a material that is the same or substantially the same as the material of the conductive layer 606A. When conductive layers 606A and 606C include the same material, the material layer stack is symmetric. In different embodiments, conductive layer 606C can have a different thickness than the conductive layer 606A. It is desirable for conductive layer 606C to be as thin as possible to facilitate fabrication. In embodiments, conductive layer 606C is deposited to a thickness, $T_3$, between 3 nm and 30 nm.

The deposition process concludes with the formation of a hardmask layer 608 on the conductive layer 606C. In some embodiment, the hardmask layer 608 is blanket deposited by a PECVD, CVD or PVD process. In an embodiment, the hardmask layer 608 includes a material that has a favorable etch selectivity compared to the ferroelectric materials in the material layer stack 606. In at least one embodiment, the hardmask layer 608 includes materials that can be patterned with high fidelity with respect to a masking layer formed on the hardmask layer 608, for example SiO2, Si3N4, DLC (Diamond Like Carbon) or Al2O3. In at least one embodiment, the hardmask layer 608 may include a conductive material that is different from the conductive material of the ferroelectric material. In at least one embodiment, it is desirable to deposit hardmask layer 608 to a thickness, $T_4$, that enables patterning of at least the conductive layer 606C. In other embodiments, hardmask layer 608 may deposited to a thickness, $T_4$, that depends on a total thickness of material layer stack 606. $T_4$ may be at least 20 nm.

In an embodiment, a photoresist mask 609 is formed on the hardmask layer 608 and is formed by a lithographic process. The photoresist mask 609 includes blocks 609A and 609B. Each block 609A-B is a mask for patterning a discrete FeRAM device.

Figure 6D:
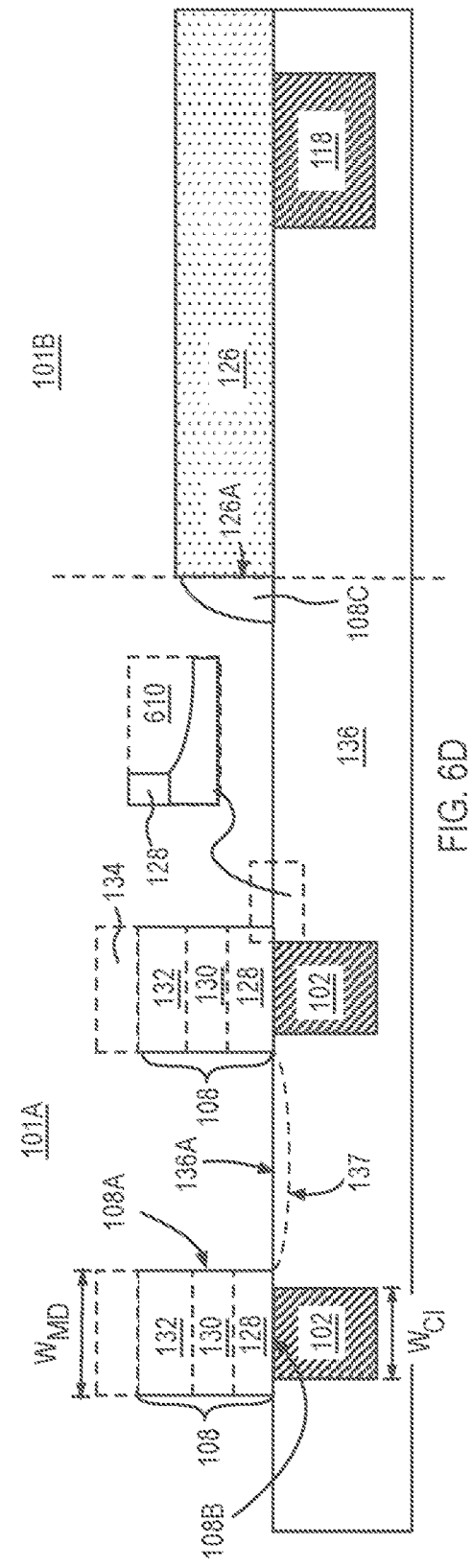
FIG. 6D is a cross-sectional illustration of the structure in FIG. 2D following the process to form ferroelectric memory devices.

FIG. 6D is a cross-sectional illustration of the structure in FIG. 2D following the process to pattern hardmask layer and the layers in the material layer stack 606. In an embodiment, the hardmask layer is etched by a plasma etch process to form hardmask 134. The plasma etch process may include a discharge produced by a magnetic enhanced reactive ion etching mechanism, an electron cyclotron resonance discharge or an inductively coupled plasma discharge. The plasma parameters maybe characterized by a range of plasma densities such as between 1e9-1e12 ions/cm³, pressures in the range of 0.001-10 Torr, and electron temperatures in the range of 1-8 eV. It is highly desirable to pattern to form hardmask 134 to have substantially vertical side walls to prevent increase in the lateral thickness when patterning the remaining layers in the material layer stack 606.

In an exemplary embodiment, the hardmask 134 has a substantially vertical profile relative to a lowermost surface 136A. In at least one embodiment, the photo resist mask 609 is removed after forming the hardmask 134. The plasma etch process is continued to pattern conductive layer 606C. The hardmask 134 is utilized to pattern conductive layer 606C. In an embodiment, a plasma etch process is utilized to etch the conductive layer 606C to form a top electrode 132. In at least one embodiment, the top electrode 132 has substantially vertical sidewalls 132A. In other embodiments, the sidewalls 132A are not vertical and have a slope that is different from 90° with respect to a normal to lowermost surface 132B. In at least one embodiment, the hardmask 134 is removed during the plasma etch process as shown, when the hardmask 134 includes a dielectric material. The etch process is continued to etch ferroelectric dielectric layer 606B to form etched ferroelectric dielectric layer 130 (herein ferroelectric dielectric layer 130). In other embodiments, the sidewalls 130A of the ferroelectric dielectric layer 130 are sloped.

The plasma etch process is continued to pattern and form a bottom electrode 128. In an embodiment, the process utilized to etch conductive layer 606A (FIG. 6C) to form bottom electrode 128 may be substantially the same as the etch process utilized to form top electrode 132. In at least one embodiment, sidewalls 108A of the ferroelectric memory device 108 are substantially vertical respect to a normal to surface 136A or surface 108B. In other embodiments, the sidewalls 108A are not vertical and have a slope that is different from 90° with respect to a normal to surface 136A or surface 108B. The process of forming the top electrode 132, ferroelectric dielectric layer 234, bottom electrode 128 also completes formation of ferroelectric memory device 108.

In an embodiment, stack portion 108C including one or more layers in the ferroelectric memory device 108 are also left as a spacer adjacent to sidewall 126A of etch stop layer 126. In different embodiments, the stack portion 108C extends to various points along the sidewall 126A. In at least one embodiment, the dielectric 136 is also recessed relative to uppermost surface 136A, as indicated within the enhanced image in box 610 and by dashed lines 137 during patterning to form bottom electrode 128.

FIG. 6E is a cross-sectional illustration of the structure in FIG. 6D following the process to deposit an encapsulation layer 114 on the ferroelectric memory devices 108, on portion 108C, and on the dielectric 136. In an embodiment, the encapsulation layer 114 includes silicon and one or more of carbon, nitrogen and oxygen. The encapsulation layer 114 may be deposited by a PVD, PECVD or an ALD process. In exemplary embodiments, the encapsulation layer 114 includes a material that is different from a material of the etch stop layer 126. The encapsulation layer 114 may include a same elemental composition but differ in dopant concentrations. Differing dopant concentrations may enable etch stop layer 126 to have a higher etch selectivity relative to encapsulation layer 114.

The deposition process utilized to form encapsulation layer 114 may result in conformal deposition on uppermost surface 108B and on sidewall surfaces 108B of the ferroelectric memory devices 108. In other embodiments, the etch stop layer 126 may be wider at the uppermost surface 108A and narrower at the base of the ferroelectric memory device 108. The encapsulation layer 114 may be deposited to a thickness, $T_{EC}$, between 5 nm and 30 nm. The thickness, $T_{EC}$, depends on a maximum spacing, $S_{MT}$, between adjacent ferroelectric memory devices 108.

FIG. 6F is a cross-sectional illustration of the structure in FIG. 6E following the process to form a mask 611 on the encapsulation layer 114 to isolate each ferroelectric memory device 108. As shown in mask 611 includes a mask portion 611A at the interface between memory region 101A and logic region 101B. In an embodiment, the mask 611 is formed by a lithographic process and includes a photoresist material. The mask portion 611A may be wider or narrower than depicted. In exemplary embodiments the mask portion 611A may have a width, $W_K$, that is sufficiently narrow to remove portion 108C.

Mask 611 may not be perfectly symmetric about each ferroelectric memory device 108. An asymmetric mask may cause lateral portions of the encapsulation layer 114 to be disproportionate about sidewall 108A. For example, some portions maybe wider than others. However, the level of disproportionality may be preserved across each ferroelectric memory device 108. Such disproportionality is not expected to result in degradation to device performance.

FIG. 7A is a cross-sectional illustration of the structure in FIG. 6F following the process to etch the encapsulation layer 114. In an embodiment, a plasma etch process is utilized to etch the encapsulation layer 114 selective to the etch stop layer 126. As discussed above, the encapsulation layer 114 and the etch stop layer 126 may include materials that are similar, such as silicon nitride doped with impurities. Differences in dopant species may provide selectivity to etch stop layer 126 which etching encapsulation layer 114. In at least one embodiment, the encapsulation layer 114 is removed from masked areas such as from sidewalls of stack portion 108C, as will be discussed below.

FIG. 7B is a plan-view illustration of the structure in FIG. 7A, in an embodiment where the conductive interconnects 102 are discrete islands and the mask forms a substantially circular encapsulation layer 114 around sidewall 108A of ferroelectric memory device 108. In other embodiments, the encapsulation layer 114 may be rectangular as indicated by dashed lines 114D. A plan view profile of the ferroelectric memory device 108 can be independent of a plan view profile of the encapsulation layer 114.

FIG. 7D is a plan-view illustration of the structure in FIG. 7A, in an embodiment where the conductive interconnects 102 are trenches and the mask forms an encapsulation layer 114 around sidewall 108A of ferroelectric memory device 108. As shown, the encapsulation layer 114 also extends parallel to the conductive trench interconnects 102, has a lateral extension $L_{EX}$, and resembles the structure depicted in FIG. 2B.

With reference to the encapsulation layer 114 in FIGS. 7B-7C, outer sidewall 114A of encapsulation layer 114 may not be perfectly symmetric about each ferroelectric memory device 108. An asymmetric mask discussed above may cause lateral portions of the encapsulation layer 114 to be disproportionate about sidewall 108A. For example, some portions maybe wider than others. However, the level of disproportionality may be preserved across each ferroelectric memory device 108. Such disproportionality is not expected to result in degradation to device performance.

Figure 8A:
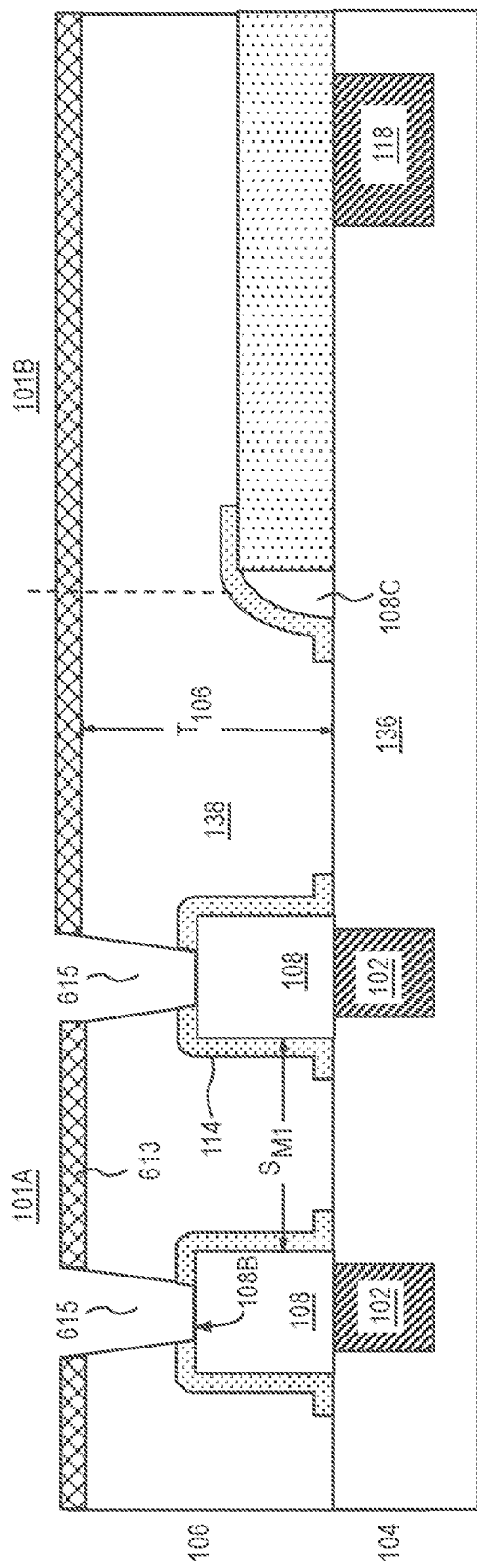
FIG. 8A is a cross-sectional illustration of the structure in FIG. 7A following the process to form openings in a second dielectric formed above the ferroelectric memory devices.

FIG. 8A is a cross-sectional illustration of the structure in FIG. 7A following the process to form openings in a dielectric formed above the ferroelectric memory devices 108. In an embodiment, a blanket deposition process is utilized to deposit a dielectric 138 on the encapsulation layer 114, on the dielectric 136 and on the etch stop layer 126. The deposition process may be carried out by a PVD, PECVD or a chemical vapor deposition (CVD) process. The dielectric 138 may be planarized after deposition. A mask 613 may be formed on the dielectric 138 by a lithographic process. In an embodiment, openings 615 may be formed in the dielectric 138 by a plasma etch process. The etch process is continued the encapsulation layer 114 is completely etched above the ferroelectric memory device 108 in the openings 615. Depending on embodiments discussed in FIGS. 1A, 1D and 1E, the etch process is further continued to etch a hard mask (if present) and expose upper most surface 108B of each ferroelectric memory device 108, or if not present, expose upper most surface 108B as illustrated. In at least one embodiment, the openings 615 are tapered. In other embodiments, the openings 615 are substantially vertical.

A total depth of opening 615 is dependent on a vertical thickness, $T_{MD}$, of the ferroelectric memory devices 108. As shown, dielectric 138 has a thickness that is approximately equal to the vertical thickness, $T_{106}$ of level 106. In other embodiments, where dielectric 136 is recessed as described in association with FIG. 6D, the dielectric 138 also extends below level 106 into level 104.

FIG. 8B is a cross-sectional illustration of the structure in FIG. 8A following the process to remove the mask 613 and deposit a conductive material to form via electrodes 116. In an embodiment, one or more liner layers are formed in the opening 615 on the uppermost layer of ferroelectric memory device 108. In at least one embodiment, a fill metal such as copper, tungsten, nickel, cobalt is deposited on a liner layer. The liner layer may include ruthenium or tantalum. A planarization process may be performed to remove the excess conductive material deposited on the dielectric 138. In an embodiment, the planarization process includes a chemical mechanical polish (CMP) process.

FIG. 8C is a cross-sectional illustration of the structure in FIG. 8B following the process to form a mask 617 on the dielectric 138, and on the via electrodes 116. The mask 617 is designed to form an interconnect structure in the logic region 101B. In an embodiment, the mask 617 is formed by a lithographic process and includes a photoresist material.

Figure 8D:
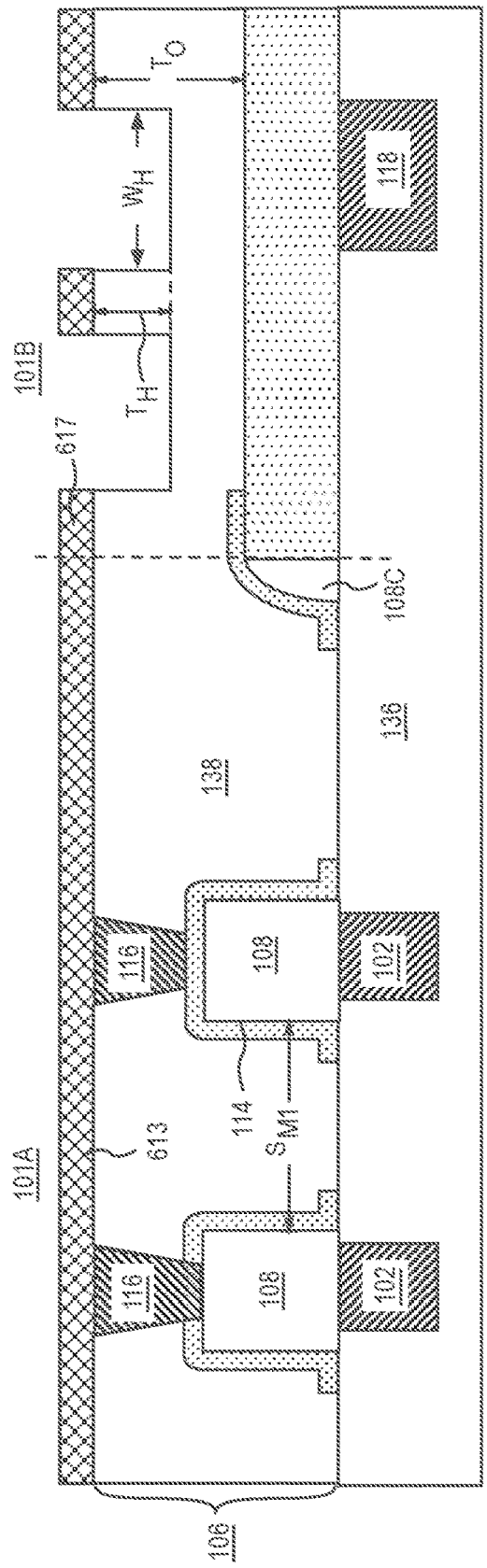
FIG. 8D is a cross-sectional illustration of the structure in FIG. 8C following the process to etch the second dielectric to form hanging trenches in the logic region 101B.

FIG. 8D is a cross-sectional illustration of the structure in FIG. 8C following the process to etch the dielectric 138 to form hanging trenches 619 in the logic region 101B. In an embodiment, a plasma etch process is utilized to etch the dielectric 138 through openings in the mask 617 to form trenches 619A, and 619B. The dielectric 138 may be etched to a depth, TH and a width, $W_H$, that is determined by a thickness $T_O$, of dielectric 138 above the etch stop layer 126. In embodiments, TH and $W_H$ range between 10 nm and 200 nm and between 10 nm and 50 nm, respectively. $W_H$ is determined by a width of interconnect vias to be formed within the trench. A height, difference between $T_O$ and $T_H$, of the remaining dielectric 138 (as measured from an uppermost surface of the etch stop layer 126) may also be determined by a height and width of a via to be formed within trench 619B. The height and width of a via is determined by a desired minimum line conductance of the via to be formed within trench 619B.

Figure 8E:
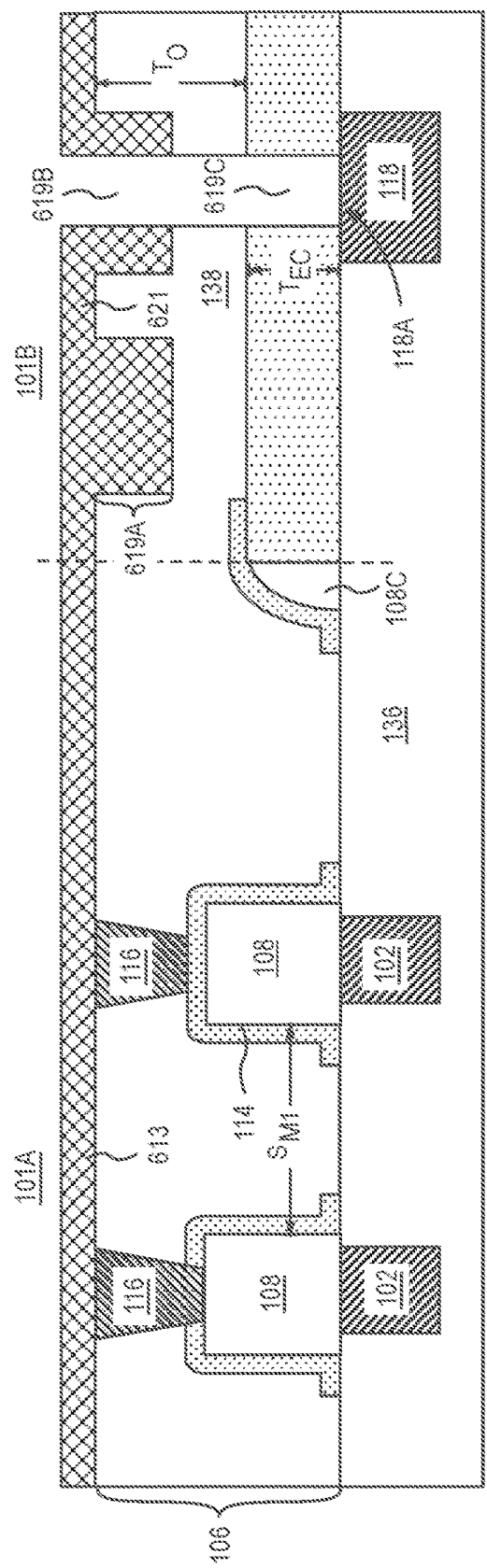
FIG. 8E is a cross-sectional illustration of the structure in FIG. 8D following the process to etch the second dielectric to form a via within in the hanging trench in the logic region.

FIG. 8E is a cross-sectional illustration of the structure in FIG. 8D following the process to etch the dielectric 138 to form a via within in the hanging trench in the logic region 101B. In an embodiment, mask utilized to form trenches 619A and 619B is removed and a new mask 621 is formed. In an embodiment, the mask 621 is formed by a lithographic process and includes a photoresist material. The mask 621 has an opening within trench 619A that is designed to enable etching the dielectric 138 to form a via opening 619C as shown. In at least one embodiment, mask 621 does not include an opening within trench 619A in the plane of the Figure but may include an opening in a plane that is behind or in front. In an embodiment, a plasma etch process is utilized to form via opening 619C by etching the dielectric 138 and etch stop layer 126. An advantage of the process methodology outlined herein, is that etch stop layer 126 has a thickness $T_{EC}$, that is determined by a deposition process and is unaltered by the formation of ferroelectric memory device 108 in the memory region 101A. Formation of via opening 619B within the stop layer 126 can be targeted and tuned by depositing the etch stop layer 126 to a desired thickness. In at least one embodiment, the formation of via opening 619B exposes an uppermost surface 118A of the conductive interconnect 118.

Figure 8F:
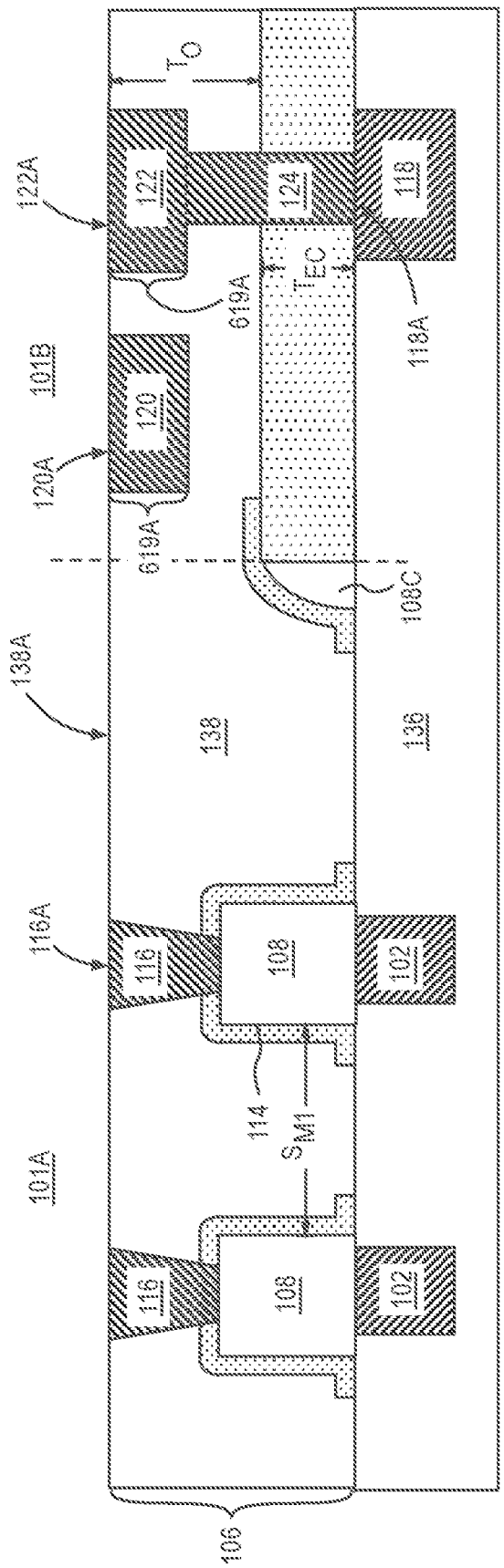
FIG. 8F is a cross-sectional illustration of the structure in FIG. 8E following the process to remove the mask and deposit a conductive material into the openings to form via and metal lines.

FIG. 8F is a cross-sectional illustration of the structure in FIG. 8E following the process to remove the mask and deposit a conductive material into the openings to form via 124, and metal lines 120 and 122. Mask utilized to form via opening 619B is removed and a conductive material is deposited into the trenches 619A, 619B and via opening 619B. In an embodiment, the conductive material includes a material that is the same or substantially the same as the material of the via electrode 116, including embodiments with or without a liner layer and fill metal on liner layer. In at least one embodiment, a fill metal includes copper, tungsten, nickel or cobalt, and a liner layer includes ruthenium or tantalum. In some such embodiments, a liner layer is deposited on uppermost surface 118A of the conductive interconnect 118, on sidewalls of the etch stop layer 126, dielectric 138, on uppermost dielectric surface 138A and on surfaces of via electrodes 116. In other embodiments where no liner is implemented a fill metal or a conductive material is directly deposited on uppermost surface 118A of the conductive interconnect 118, on sidewalls of the etch stop layer 126, dielectric 138, on uppermost dielectric surface 138A and on surfaces of via electrodes 116.

A planarization process may be utilized to remove an excess conductive material deposited on dielectric 138 and on via electrodes 116. In an embodiment, the planarization process includes a chemical mechanical polish (CMP) process. The CMP process isolates metal line 120 from metal line 122. Via 124 is formed at the same time as metal line 124.

In at least one embodiment, uppermost surfaces 116A of via electrode 116 and uppermost surfaces 120A and 122A of metal lines are co-planar or substantially co-planar after the CMP process.

In general, via electrodes 116 may be fabricated before or after fabrication of via 124 and metal line 122. The method described in association with FIGS. 8A-F can be performed so as to fabricate via 124 and metal 122 prior to fabrication of via 116.

Figure 16A:
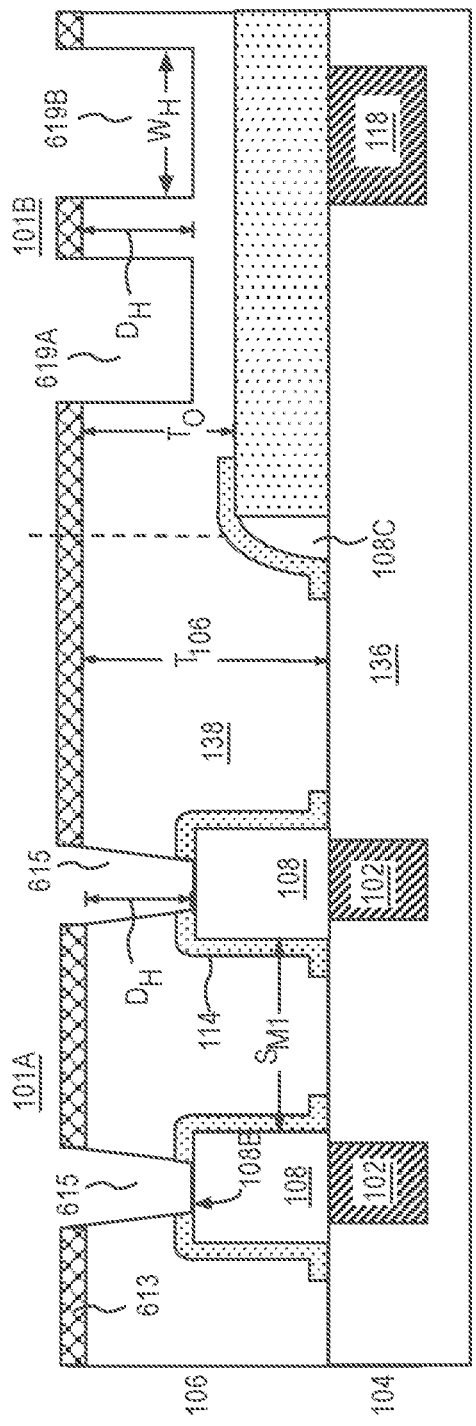
FIG. 16A illustrates the structure of FIG. 8E following the process to form openings in a second dielectric formed above the ferroelectric memory devices and form trench openings in the logic region, in accordance with at least one embodiment.

In other embodiments, such as is illustrated in FIG. 16A, opening 615, and trench openings 619A and 619B can be formed simultaneously. In some such embodiments, openings 615, and trench openings 619A and 619B can have a substantially same depth $D_H$ as shown. $D_H$ is less than a total depth $T_O$ of the dielectric 138, as shown. Trench openings 619A and 619B have a width, $W_H$. $W_H$ can be the same or different for trench openings 619A and 619B. In an embodiment, a first plasma etch is utilized to etch dielectric 138 selective to encapsulation layer 114, and a second plasma etch that is selective to dielectric 138 is utilized to etch encapsulation layer 114. In at least one embodiment, depending on thicknesses of dielectric 138 and encapsulation layer 114, $D_H$ in the logic region 101B can be greater by up to 5% compared to $D_H$ in the memory region 101A.

Figure 16B:
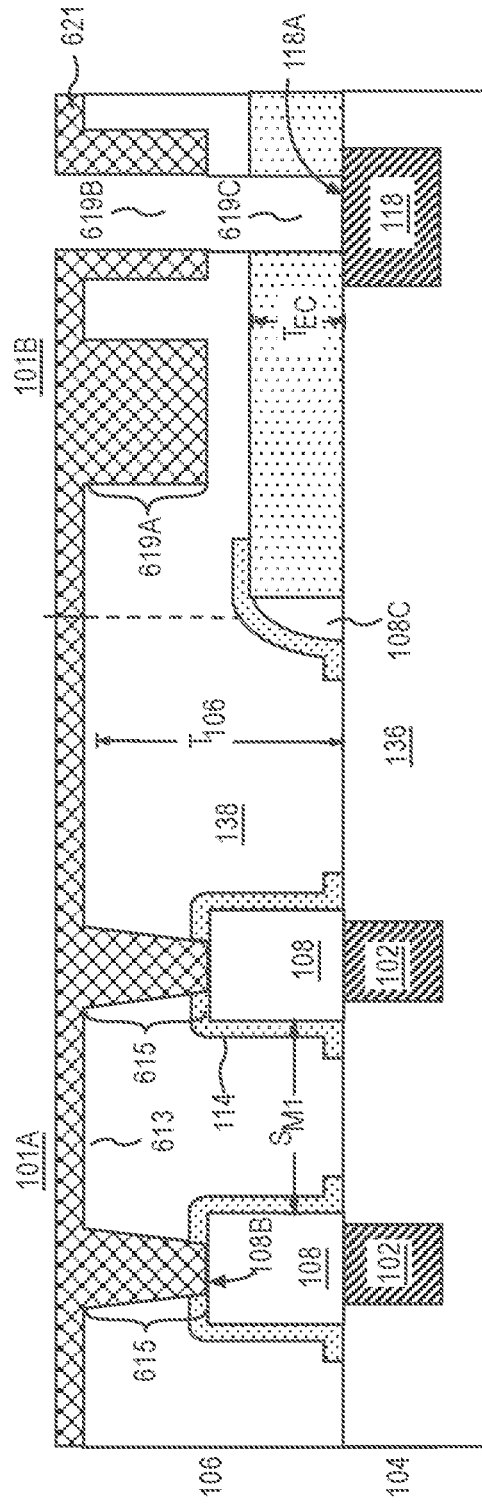
FIG. 16B illustrates the structure of FIG. 16A following the process to form a mask on the second dielectric in the openings in the memory region, in the trench openings, where the mask forms a via opening in one of the trench openings.
Figure 16C:
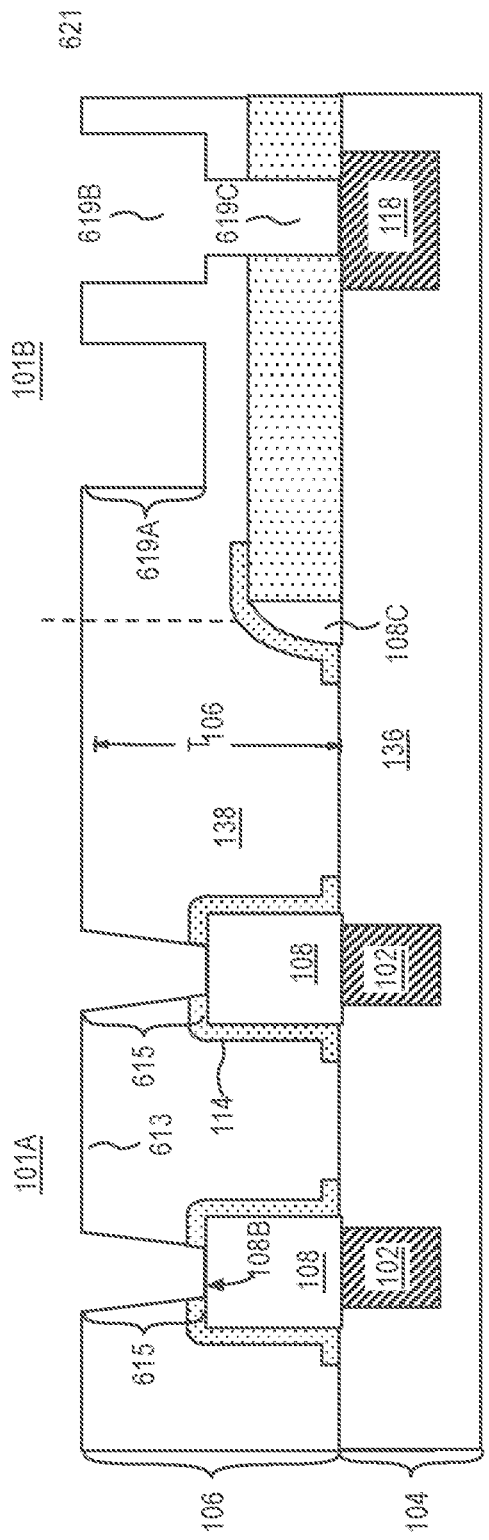
FIG. 16C illustrates the structure of FIG. 16B following the process to remove the mask and expose a ferroelectric memory device in each opening in the memory region, and remove the mask in the logic region.

The process can be continued to form mask 621 that covers openings 615 and portions of trench openings 619A and 619B, as shown in FIG. 16B. A plasma etch process described in association with FIG. 8E may be performed to form opening 619C. The plasma etch etches an entire thickness $T_{EC}$ and exposes upper most surface 118A. In at least one embodiment, remove mask 621 can be removed after formation of openings 615, and trench openings 619A and 619B as shown in FIG. 16C.

Figure 16D:
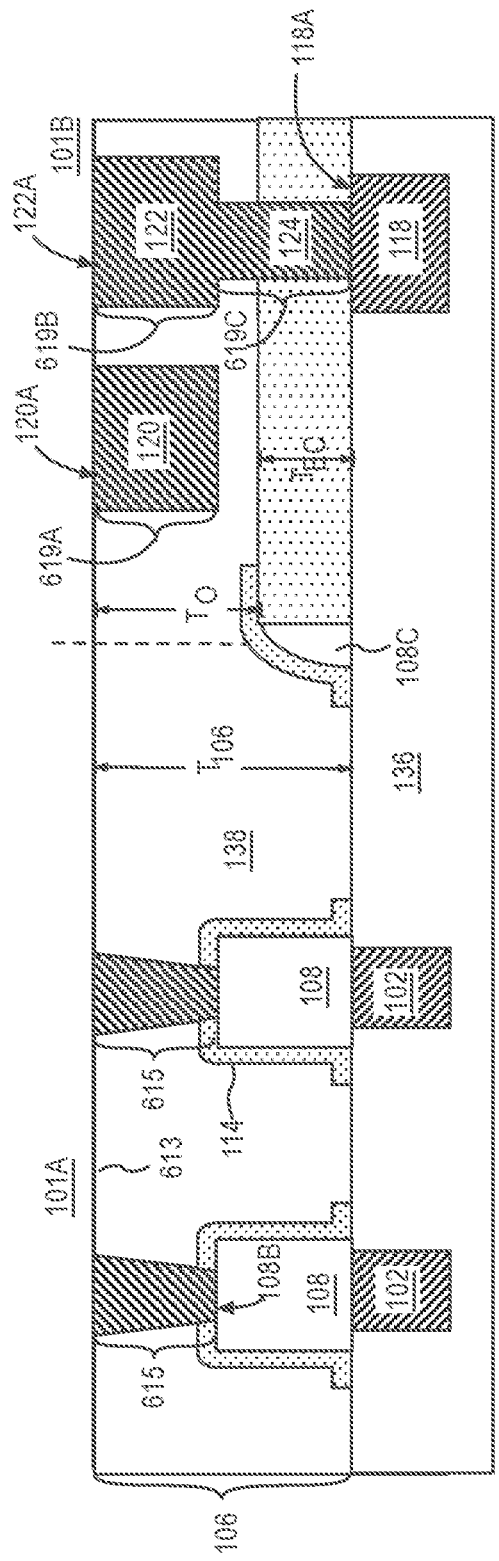
FIG. 16D illustrates the structure of FIG. 16C following the process to form via electrodes in the openings in the memory region.

The process can be continued to fill openings 616, 619A, 619B and 619C as shown in FIG. 16D. The process to fill openings 615, and trench openings 619A and 619B and form via electrodes 116, via 124 and metal lines 120 and 122 is the same or substantially the same as the method described in association with FIG. 8F.

FIG. 9A is a cross-sectional illustration of the structure in FIG. 6F, following a process to etch the encapsulation layer 114, to remove or reduce a thickness of portion 108C. In at least one embodiment, the mask portion 611A (dashed box) has been removed to facilitate easier removal of encapsulation layer 114 from above the remnant portion 108C and for removal of the remnant portion 108C in a subsequent processing operation.

In at least one embodiment, a plasma etch is utilized to etch the encapsulation layer 114 selectively with respect to etch stop layer 126 and dielectric 136.

FIG. 9B is a cross-sectional illustration of the structure in FIG. 6E following the process to form a mask 623 that covers a substantial portion of the memory region 101A and following a process to etch and remove the encapsulation layer 114 everywhere not covered by the mask 623. In at least one embodiment, the mask 623 exposes the logic region 101B. As shown, a plasma etch process is utilized to etch the encapsulation layer 114, as described in association with FIG. 7A. Referring again to FIG. 9B, the encapsulation layer remains in the memory region 101A, adjacent to stack portion 108C and over the dielectric 136. The encapsulation layer 114 extends continuously between each ferroelectric memory device 108, as shown in FIG. 3.

In other embodiments, stack portion 108C, adjacent to the encapsulation layer sidewall 126A, can be removed by an etch process, after removal of the encapsulation layer 114.

Figure 10:
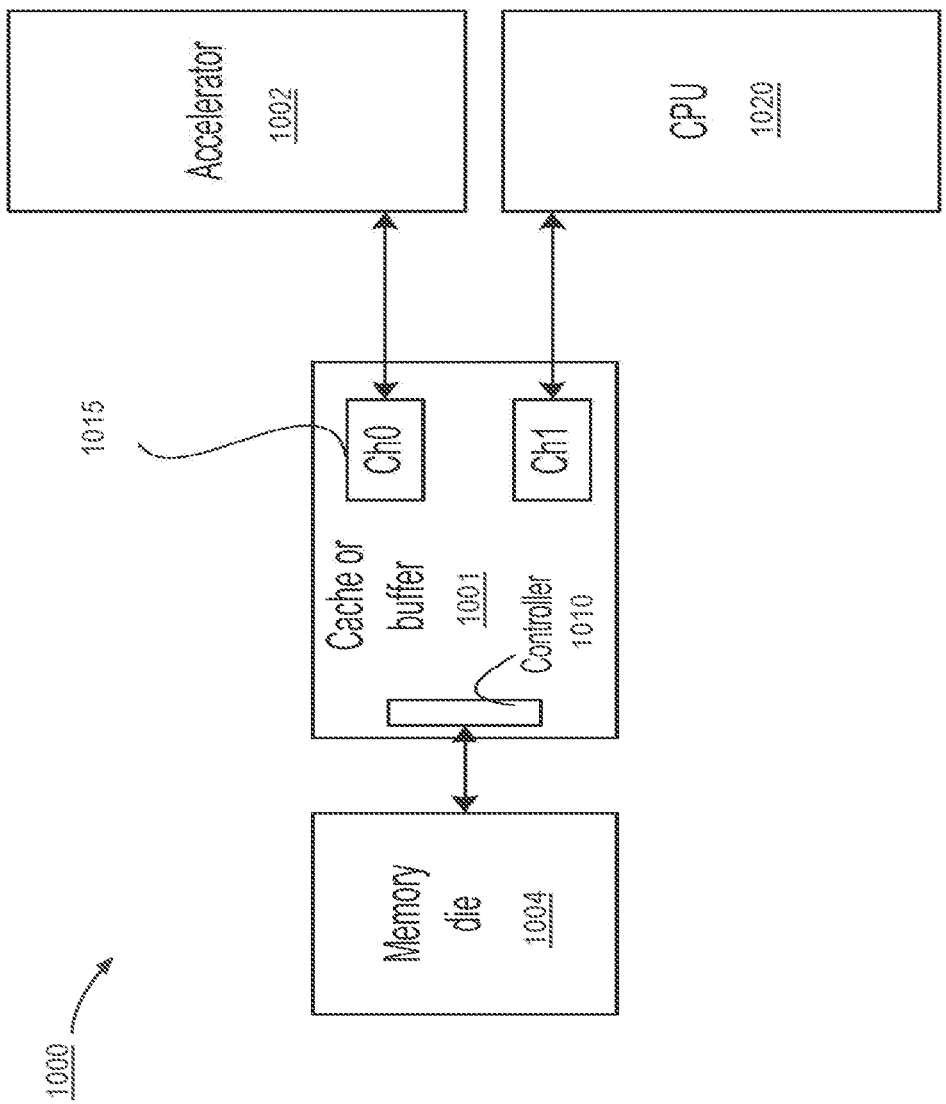
FIG. 10 illustrates a computing architecture with a coherent cache or memory-side buffer chiplet that includes a memory controller, wherein the coherent cache or memory-side buffer chiplet is coupled to an accelerator, a processor, and a memory, in accordance with at least one embodiment.
Figure 11:
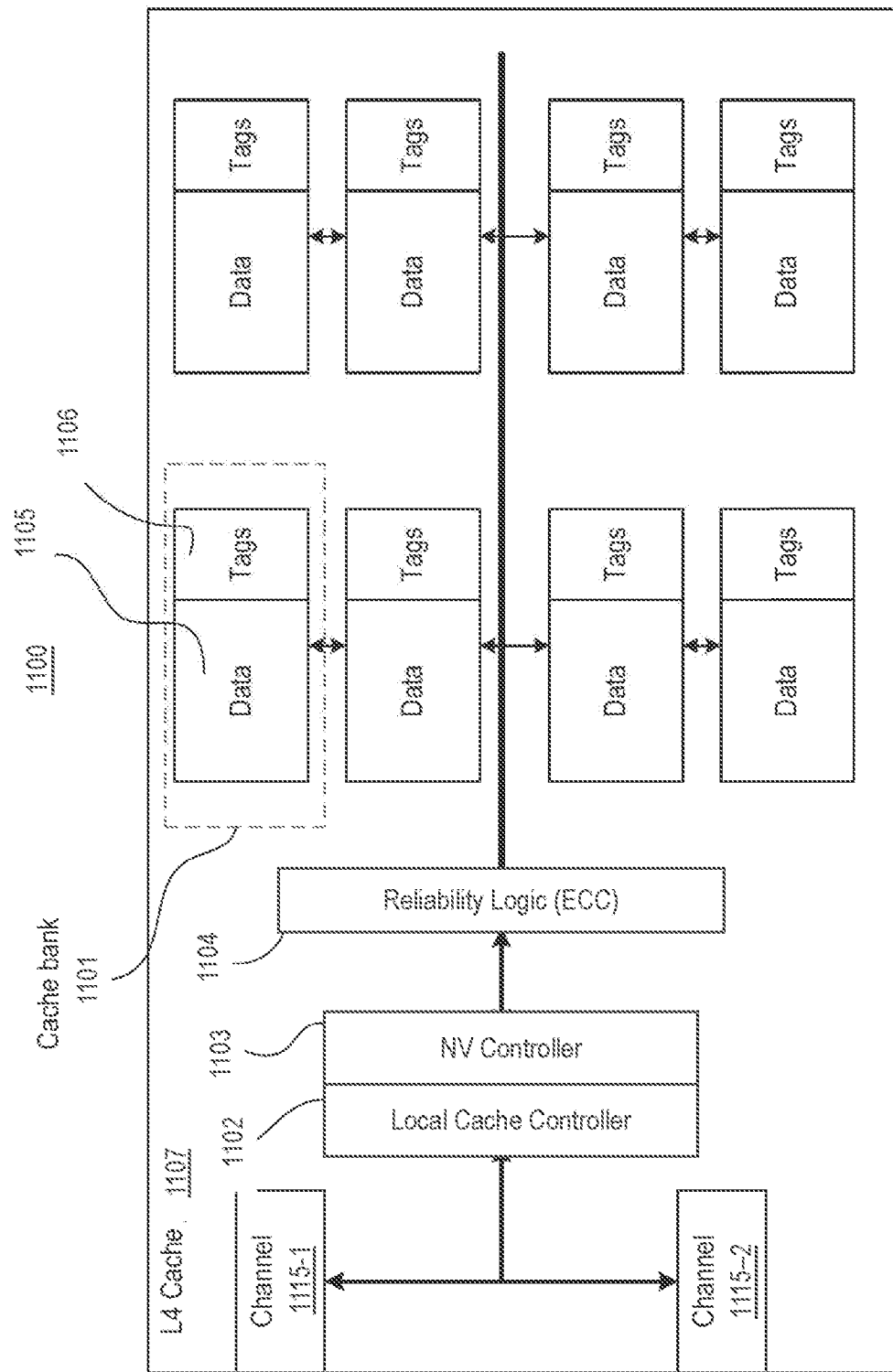

FIG. 10 illustrates computing architecture 1000 with a coherent cache or memory-side buffer chiplet that includes a memory controller, wherein the coherent cache or memory-side buffer chiplet is coupled to an accelerator, a processor, and a memory, in accordance with at least one embodiment. Computing architecture 1000 comprises coherent cache or memory-side buffer chiplet 1001, accelerator 1002 (e.g., inference chip), processor (e.g., central processing unit 1020), and memory die 1004. In at least one embodiment, coherent cache or memory-side buffer chiplet 1001 comprises at least two channels 1015 which are configured to connect with accelerator 1002 and processor 1020. In at least one embodiment, coherent cache or memory-side buffer chiplet 1001 comprises I/O and controller 1010 to manage data traffic with memory die 1004. By moving controller 1010 from processor 1020 to coherent cache or memory-side buffer chiplet 1001, cost in terms of power and die area for processor 1020 is reduced. In at least one embodiment embodiments, coherent cache or memory-side buffer chiplet 1001 is a cache memory that comprises ferroelectric memory cells. For example, coherent cache or memory-side buffer chiplet 1001 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation.

Figure 11:
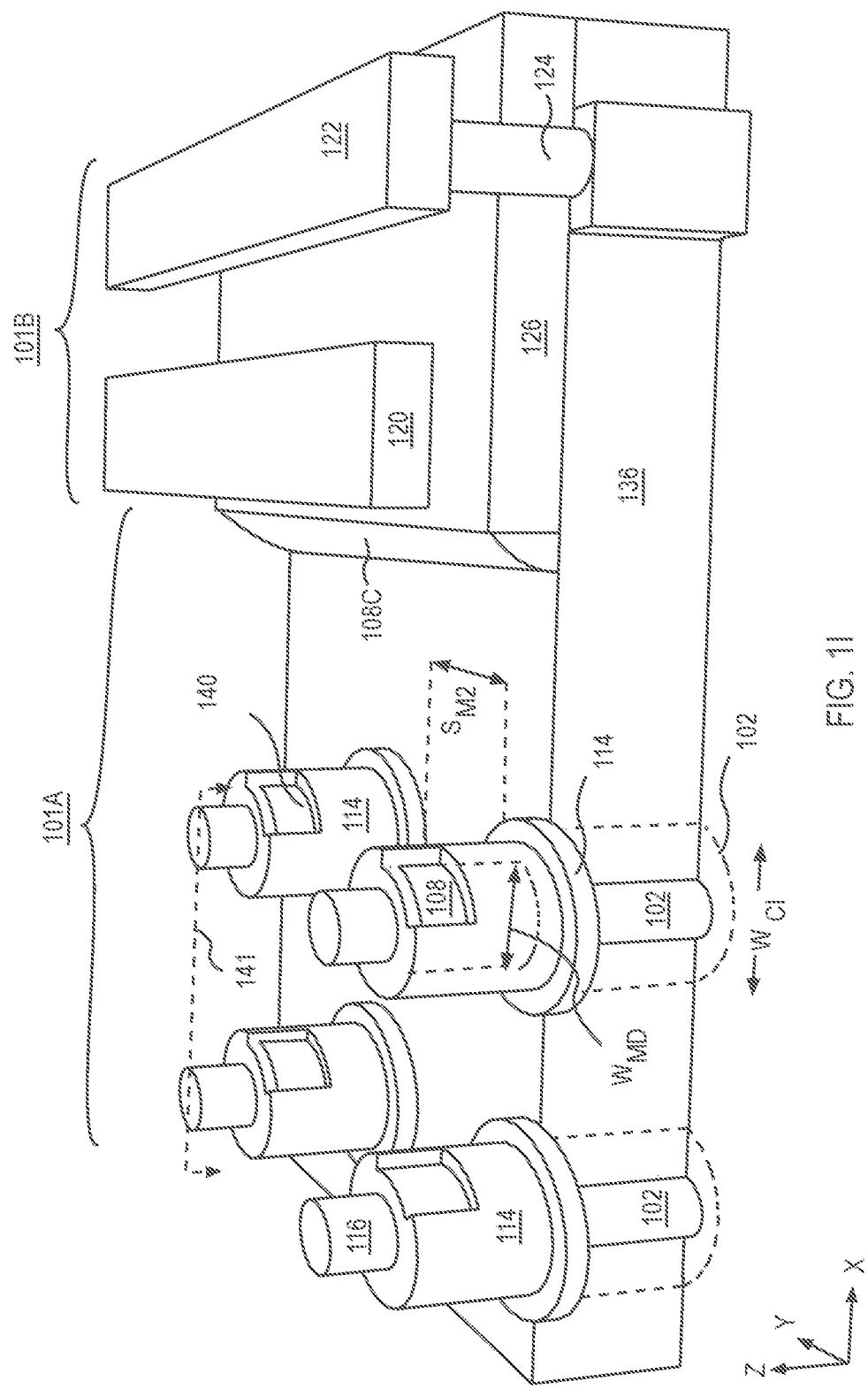
FIG. 11 illustrates an architecture of the coherent cache or memory-side buffer chiplet with multiple controllers and multiple cache banks, in accordance with at least one embodiment.

FIG. 11 illustrates architecture 1100 of the coherent cache or memory-side buffer chiplet (e.g., 1107) with multiple controllers and multiple cache banks, in accordance with at least one embodiment embodiments. In at least one embodiment, architecture 1100 comprises channels (e.g., ch0 1115-1 and ch1 1115-2), cache banks 1101, local cache controller 1102, non-volatile (NV) controller 1103, and reliability logic 1104. Coherent cache or memory-side buffer chiplet 1107 may function as a cache or memory buffer. In at least one embodiment, cache lookups can map a large physical memory into a small physical cache through the use of indirection via tags. Here, indirection refers to the use of tags to specify which address maps to which physical location. If multiple addresses can map to a physical location, a tag is used to figure out which address is currently mapped.

In at least one embodiment, each cache bank 1101 includes data bank 1105 (e.g., comprising memory cells) and associated tags 1106. In at least one embodiment, data bank 1105 comprises ferroelectric memory cells. In at least one embodiment, data bank 1105 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation. In at least one embodiment, when data bank 1105 includes ferroelectric memory, it uses NV controller 1103 and a stronger reliability logic (e.g., error correction code) for security compared to non-ferroelectric memory for data bank 1105.

When data region 1105 is used to implement a cache, tags may be used to identify which addresses map to which physical locations in the bank. The cache may be set associative in which a particular address can map to several physical locations. The specific physical location a newly allocated address is mapped to may be determined by a replacement algorithm such as LRU (least recently used) or pseudo-LRU, or even random. On the other hand, the cache might be direct mapped, with each address mapping to merely a physical cache line. In both set associative and direct mapped caches, several addresses map to a physical cache line. To identify the address currently occupying the physical cache line, a tag 1106 may be coupled with each physical line. Tag 1106 may comprise some address bits, sufficient to uniquely identify which address currently occupies the physical line coupled with the tag.

In at least one embodiment, cache controller 1102 could be used to control state transitions required for cache look ups such as comparing requested addresses with tags stored in the tag array 1106, and identifying a candidate for replacement (replacement algorithm) when a cache miss occurs. In addition, the cache controller could be tasked with initializing the cache when the cache powers on. When FE memory of data region 1105, which retains state across power cycles, is used, cache controller 1102 could write 0s to all memory locations to ensure that data associated with previously executed programs is erased, preventing any data leakage to subsequently executed programs. The non-volatile memory may also include an NV bit, which could indicate that cache data is meant to be non-volatile and remain across power cycles. Cache controller 1102 would skip locations marked thus when initializing memory.

In at least one embodiment, reliability logic 1104 performs error correction to the data. Any suitable error correction scheme (e.g., with error correction code (ECC)) may be used by reliability logic 1104. In at least one embodiment, NV controller 1103 is provided to explicitly clear the cache when using a non-volatile memory, such as FM memory for data region 1105. NV controller 1103 may include an NV bit which indicates cache lines that should not be cleared but are expected to retain their contents across power cycles. The functions of NV controller 1103 can be combined in cache controller 1102, or vice versa.

Figure 12:
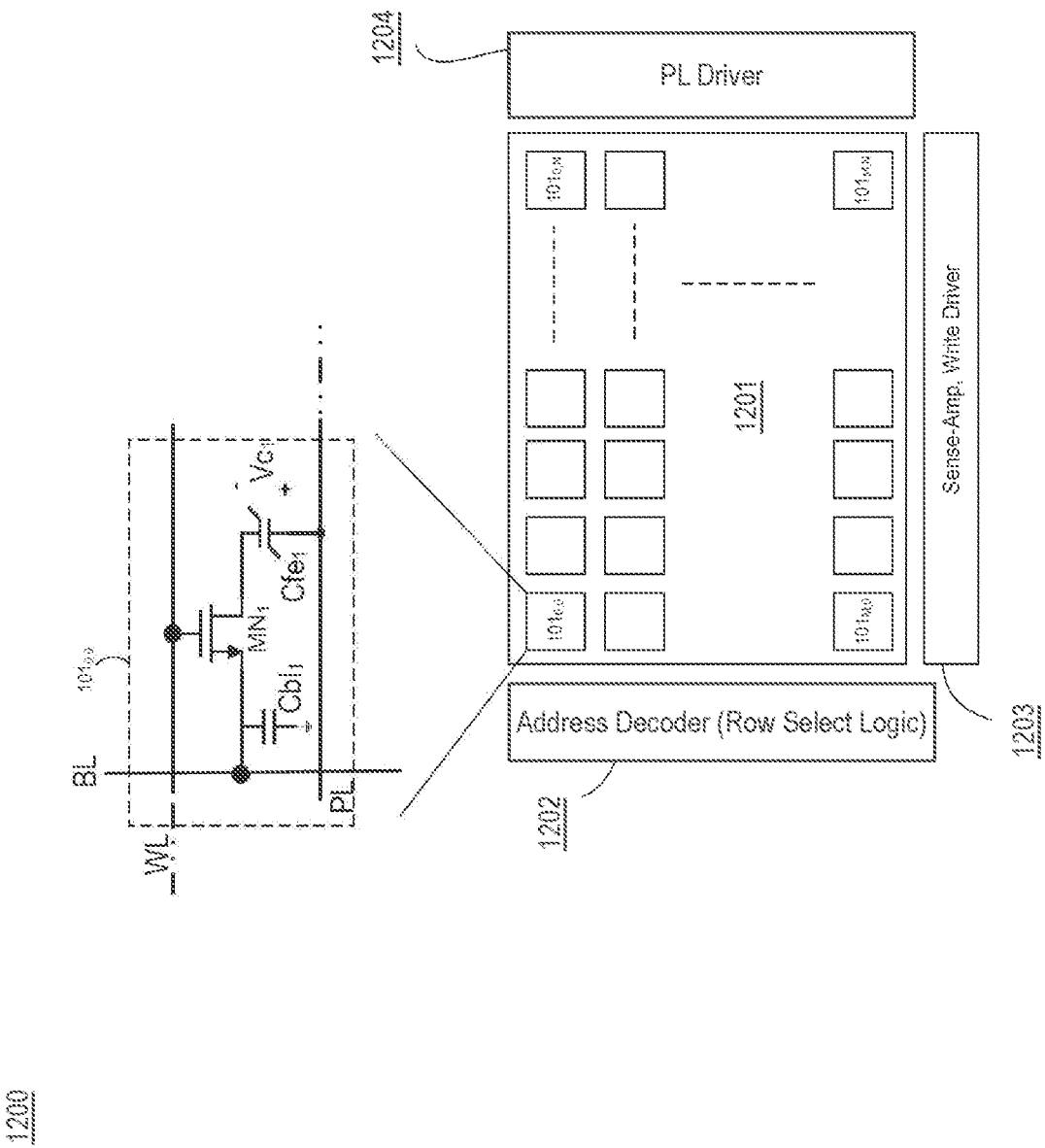
FIG. 12 illustrates an apparatus comprising memory and corresponding logic, wherein the memory comprises ferroelectric (FE) memory bit-cells, in accordance with at least one embodiment.

FIG. 12 illustrates apparatus 1200 comprising memory and corresponding logic, wherein the memory comprises ferroelectric (FE) memory bit-cells, in accordance with at least one embodiment. Apparatus 1200 comprises M×N memory array 1201 of bit-cells, logic circuitry 1202 for address decoding, sense amplifier and write drivers 1203, and plate-line (PL) driver 1204. Logic 1202 comprises address decoders for selecting a row of bit-cells and/or a particular bit-cell from M×N array 1201, where M and N are integers of same or different values. Logic 1203 comprises sense-amplifiers for reading the values from the selected bit-cell, while write drivers are used to write a particular value to a selected bit-cell. Here, a schematic of FE bit-cell $1201_{0,0}$ is illustrated. The same embodiments apply to other bit-cells of the M×N array. In this example, a one-transistor one-capacitor (1T1C) bit cell is shown, but the embodiments are applicable to 1TnC bit-cell and multi-element FE gain bit-cell as described herein.

In at least one embodiment, bit-cell $1201_{0,0}$ comprises a word-line (WL), a plate-line (PL), a bit-line (BL), a complementary bit-line (BLB), and two half bit-cells $1201_{0,0\_A}$ and $1201_{0,0\_B}$. In at least one embodiment, bit-cell $1201_{0,0}$ comprises an n-type transistor $MN_1$, and FE capacitive structure $Cfe_1$. The gates of transistor $MN_1$ are coupled to a common WL. In various embodiments, one terminal of the FE capacitive structure $Cfe_1$ is coupled to a PL. The second terminal of the FE capacitive structure is coupled to source or drain terminal of the transistor $MN_1$. In various embodiments, BL is coupled to the source or drain terminal of first transistor $MN_1$. In at least one embodiment, a BL capacitor $CBl_1$ is coupled to the source or drain terminal of first transistor $MN_1$ and to a reference node (e.g., ground such that the FE capacitor is not coupled to the same source or drain terminal. In at least one embodiment, the PL is parallel to the BL and orthogonal to the WL. In at least one embodiment, the PL is parallel to the WL and orthogonal to the BL.

In at least one embodiment, the FE capacitor is a planar capacitor. In at least one embodiment, the FE capacitor is a pillar or non-planar capacitor. In at least one embodiment, when the bit-cell is a 1TnC bit-cell, the FE capacitors are configured in a tower structure allowing the x-y foot-print to remain the same as for a 1T1C bit-cell but with taller bit-cell in the z-direction. In at least one embodiment, when the bit-cell is a multi-element FE gain bit-cell, the bit-cell allows for decoupling of the storage node from BL, allows for reducing the thickness scaling requirement for pillar capacitors, and allows for reducing polarization density requirements. Further, by stacking the 'n' capacitors in the z-direction (forming a tower), the area increases in the x-y direction due to the two transistors. The increase in area (due to the two transistors per bit-cell) allows for expanding the sizes (or radius) of the capacitors in the x-y direction.

Figure 13:
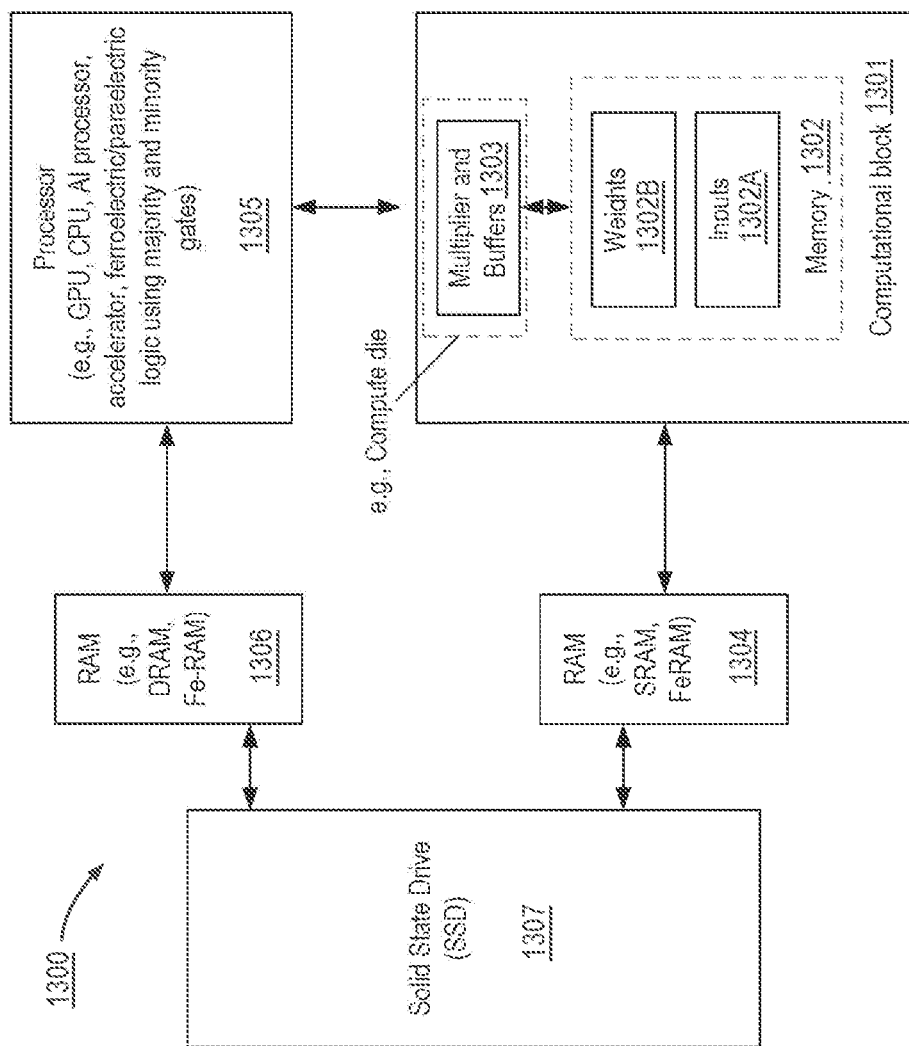
FIG. 13 illustrates a high-level architecture of an artificial intelligence (AI) machine comprising a compute die positioned on top of a memory die, in accordance with at least one embodiment.

FIG. 13 illustrates a high-level architecture of an artificial intelligence (AI) machine 1300 comprising a compute die positioned on top of a memory die, in accordance with at least one embodiment. AI machine 1300 comprises computational block 1301 or processor having random-access memory (RAM) 1302 and computational logic 1303; first random-access memory 1304 (e.g., static RAM (SRAM), ferroelectric or paraelectric RAM (FeRAM), ferroelectric or paraelectric static random-access memory (FeSRAM)), main processor 1305, second random-access memory 1306 (dynamic RAM (DRAM), FeRAM), and solid-state memory or drive (SSD) 1307. In at least one embodiment, some or all components of AI machine 1300 are packaged in a package forming a system-on-chip (SoC). The SoC can be configured as a logic-on-logic configuration, which can be in a 3D configuration or a 2.5D configuration.

In at least one embodiment, computational block 1301 is packaged in a package and then coupled to processor 1305 and memories 1304, 1306, and 1307 on a printed circuit board (PCB). In at least one embodiment, computational block 1301 is configured as a logic-on-logic configuration, which can be in a 3D configuration or a 2.5D configuration. In at least one embodiment, computational block 1301 comprises a special purpose compute die 1303 or microprocessor. For example, compute die 1303 is a compute chiplet that performs a function of an accelerator or inference. In at least one embodiment, memory 1302 is DRAM which forms a special memory/cache for the special purpose compute die 1303. The DRAM can be embedded DRAM (eDRAM) such as 1T-1C (one transistor and one capacitor) based memories. In at least one embodiment, RAM 1302 is ferroelectric or paraelectric RAM (Fe-RAM).

In at least one embodiment, compute die 1303 is specialized for applications such as Artificial Intelligence, graph processing, and algorithms for data processing. In at least one embodiment, compute die 1303 further has logic computational blocks, for example, for multipliers and buffers, a special data memory block (e.g., buffers) comprising DRAM, FeRAM, or a combination of them. In at least one embodiment, RAM 1302 has weights and inputs stored in-order to improve the computational efficiency. The interconnects between processor 1305 (also referred to as special purpose processor), first RAM 1304 and compute die 1303 are optimized for high bandwidth and low latency. The architecture of FIG. 13 allows efficient packaging to lower the energy, power, or cost and provides for ultra-high bandwidth between RAM 1302 and compute chiplet 1303 of computational 1301.

In at least one embodiment, RAM 1302 is partitioned to store input data (or data to be processed) 1302a and weight factors 1302b. In at least one embodiment, input data 1302a is stored in a separate memory (e.g., a separate memory die) and weight factors 1302b are stored in a separate memory (e.g., separate memory die).

In at least one embodiment, computational logic or compute chiplet 1303 comprises matrix multiplier, adder, concatenation logic, buffers, and combinational logic. In various embodiments, compute chiplet 1303 performs multiplication operation on inputs 1302a and weights 1302b. In at least one embodiment, weights 1302b are fixed weights. For example, processor 1305 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 1302b. In various embodiments, the input data, that is to be analyzed using a trained model, is processed by computational block 1301 with computed weights 1302b to generate an output (e.g., a classification result).

In at least one embodiment, first RAM 1304 is ferroelectric or paraelectric based SRAM. For example, a six transistor (6T) SRAM bit-cells having ferroelectric or paraelectric transistors are used to implement a non-volatile FeSRAM. In at least one embodiment, SSD 1307 comprises NAND flash cells. In at least one embodiment, SSD 1307 comprises NOR flash cells. In at least one embodiment, SSD 1307 comprises multi-threshold NAND flash cells.

In various embodiments, the non-volatility of FeRAM is used to introduce new features such as security, functional safety, and faster reboot time of architecture 1300. The non-volatile FeRAM is a low power RAM that provides fast access to data and weights. FeRAM 1304 can also serve as a fast storage for inference die 1301 (or accelerator), which typically has low capacity and fast access requirements.

In various embodiments, the FeRAM (FeDRAM or FeSRAM) includes ferroelectric or paraelectric material. The ferroelectric or paraelectric (FE) material may be in a transistor gate stack or in a capacitor of the memory. The ferroelectric material can be any suitable low voltage FE material that allows the FE material to switch its state by a low voltage (e.g., 1300 mV). Threshold in the FE material has a highly non-linear transfer function in the polarization vs. voltage response. The threshold is related a) non-linearity of switching transfer function, and b) to the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of a FE layer. A perfectly epitaxial, crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In at least one embodiment, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In at least one embodiment, the perovskite can be doped (e.g., by La or Lanthanides). In various embodiments, when the FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In at least one embodiment, the FE material comprises hexagonal ferroelectrics of the type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In at least one embodiment, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In at least one embodiment, the FE material is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, etc. may be used for FE material 213. Perovskites can be suitably doped to achieve a spontaneous distortion in a range of 0.3 to 2%. For chemically substituted BiFeO3, BrCrO3, BuCoO3 class of materials, La or rate earth substitution into the Bi site can tune the spontaneous distortion. In at least one embodiment, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In at least one embodiment, the FE material comprises a stack of layers including low voltage FE material between conductive oxides. In various embodiments, when the FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability. In various embodiments, when metallic perovskite is used for the FE material, the conductive oxides can include one or more of: $IrO_2$, $RuO_2$, $PdO_2$, $OsO_2$, or $ReO_3$. In at least one embodiment, the perovskite is doped with La or Lanthanides. In at least one embodiment, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as the conductive oxides.

In at least one embodiment, ferroelectric materials are doped with s-orbital material (e.g., materials for first period, second period, and ionic third and fourth periods). In at least one embodiment, f-orbital materials (e.g., lanthanides) are doped to the ferroelectric material to make paraelectric material. Examples of room temperature paraelectric materials include: SrTiO3, Ba(x)Sr(y)TiO3 (where x is −0.05, and y is 0.95), HfZrO2, Hf—Si—O.

In at least one embodiment, the FE material comprises one or more of: Hafnium (Hf), Zirconium (Zr), Aluminum (Al), Silicon (Si), their oxides or their alloyed oxides. In at least one embodiment, the FE material includes one or more of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In at least one embodiment, the FE material includes one or more of: Bismuth ferrite (BFO), or BFO with doping material.

In at least one embodiment, the FE material includes Bismuth ferrite (BFO), BFO with a first doping material where in the first doping material is one of Lanthanum, or any element from the lanthanide series of the periodic table. In at least one embodiment, the FE material includes a relaxor ferro-electric includes one of Barium Titanium-Bismuth Zinc Niobium Tantalum (BT-BZNT) or Barium Titanium-Barium Strontium Titanium (BT-BST).

In at least one embodiment, the FE material includes Hafnium oxides of the form, $Hf_{1-x} Ex Oy$ where E can be Al, Ca, Ce, Dy, Er, Gd, Ge, La, Sc, Si, Sr, Sn, or Y. In at least one embodiment, the FE material includes Niobate type compounds LiNbO3, LiTaO3, Lithium iron Tantalum Oxy Fluoride, Barium Strontium Niobate, Sodium Barium Niobate, or Potassium strontium niobate.

In at least one embodiment, the FE material comprises multiple layers. For example, alternating layers of [Bi2O2] 2+, and pseudo-perovskite blocks (Bi4Ti3O12 and related Aurivillius phases), with perovskite layers that are n octahedral layers in thickness can be used. In at least one embodiment, the FE material comprises organic material. For example, Polyvinylidene fluoride or polyvinylidene difluoride (PVDF).

In at least one embodiment, the FE material comprises hexagonal ferroelectrics of the type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In at least one embodiment, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In at least one embodiment, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials SnTiO3 (STO), respectively, and LaAlO3 (LAO) and STO, respectively. For example, a super lattice of [PTO/STO]n or [LAO/STO]n, where 'n' is between 1 to 1300. While various embodiments here are described with reference to ferroelectric material for storing the charge state, the embodiments are also applicable for paraelectric material. In at least one embodiment, paraelectric material includes one of: SrTiO3, Ba(x)Sr(y)TiO3, HfZrO2, Hf—Si—O.

The method of forming the structures described herein are applicable to various logic embodiments. For example, the FeRAM devices or capacitive structures formed herein can be used to forming other ferroelectric/paraelectric circuits. These circuits can be implemented majority gate, minority gate and/or threshold gate.

Following examples are provided that illustrate the various embodiments. The examples can be combined with other examples. As such, various embodiments can be combined with other embodiments without changing the scope of the invention.

Figure 14:
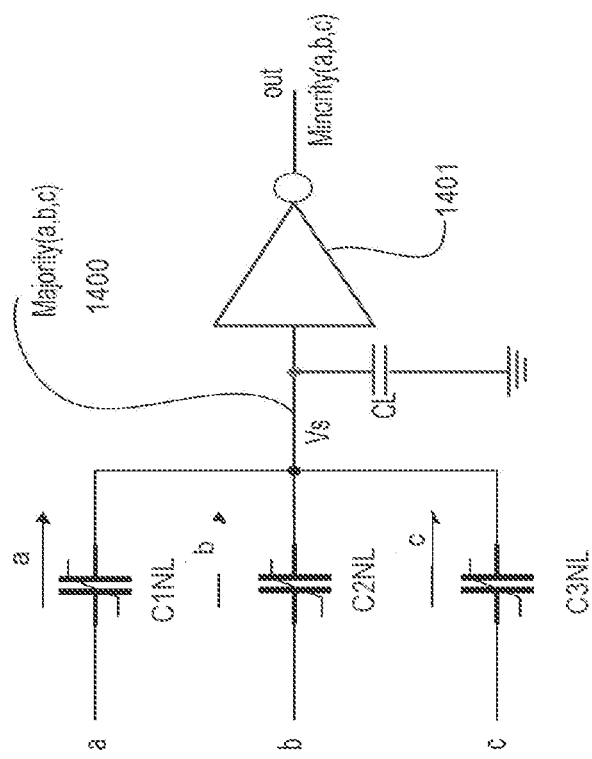
FIG. 14 illustrates a 3-input majority gate using non-linear input capacitors, in accordance with at least one embodiment.

FIG. 14 illustrates 3-input majority gate 1400 using non-linear input capacitors, in accordance with at least one embodiment. In at least one embodiment, 3-input majority gate 1400 comprises non-linear input capacitors C1n1, C2n1, and C3n1 that receives digital signals a, b, and c, respectively. Here, signal names and node names are interchangeably used. For example, 'a' refers to node 'a' or signal 'a' depending on the context of the sentence. One end or terminal of capacitor C1n1 is coupled to node a while the other end of capacitor C1n1 is coupled to summing node Vs. The same is true for other non-linear capacitors C2n1 and C3n1 as shown. In at least one embodiment, 3-input majority gate 1400 comprises a driver circuitry 1401. In this example, driver circuitry 1401 is an inverter. In other embodiments, other types of driver circuitries can be used such as NAND gate, NOR gate, multiplexer, buffer, and other logic gates. The majority function is performed at summing node Vs as Majority(a,b,c). In this example, since driver 1401 is an inverter, minority function is performed at output "out" as Minority(a,b,c).

In at least one embodiment, in addition to the gate capacitance of driver circuitry 1401, an additional linear capacitor CL is coupled to summing node Vs and ground as shown. In at least one embodiment, this linear capacitor CL is a non-ferroelectric capacitor. In at least one embodiment, the non-ferroelectric capacitor includes one of: dielectric capacitor, para-electric capacitor, or non-linear dielectric capacitor. A dielectric capacitor comprises first and second metal plates with a dielectric between them. Examples of such dielectrics are: HfOX, ABO3 perovskites, nitrides, oxy-fluorides, oxides, etc. A para-electric capacitor comprises first and second metal plates with a para-electric material between them. In at least one embodiment, f-orbital materials (e.g., lanthanides) are doped to the ferroelectric materials to make paraelectric material. Examples of room temperature paraelectric material include: SrTiO3, Ba(x)Sr(y)TiO3, HfZrO2, Hf—Si—O, La-substituted PbTiO3, PMN-PT based relaxor ferroelectrics. A dielectric capacitor comprises first and second metal plates with non-linear dielectric capacitor between them. The range for dielectric constant is 1.2 to 10000. The capacitor CL can be implemented as MIM (metal-insulator-metal) capacitor technology, transistor gate capacitor, hybrid of metal capacitors or transistor capacitor. The capacitor CL can be implemented as MIM (metal-insulator-metal) capacitor technology, transistor gate capacitor, or hybrid of metal capacitors or transistor capacitor.

In at least one embodiment, the non-linear input capacitors C1n1, C2n1, and C3n1 comprise non-linear polar material. In at least one embodiment, the non-linear polar material includes one of: ferroelectric (FE) material, para-electric material, relaxor ferroelectric, or non-linear dielectric. In various embodiments, para-electric material is the same as FE material but with chemical doping of the active ferroelectric ion by an ion with no polar distortion. In some cases, the non-polar ions are non-s orbital ions formed with p, d, f external orbitals. In at least one embodiment, non-linear dielectric materials are same as para-electric materials, relaxors, and dipolar glasses.

In at least one embodiment, f-orbital materials (e.g., lanthanides) are doped to the ferroelectric material to make paraelectric material. Examples of room temperature paraelectric material include: SrTiO3, Ba(x)Sr(y)TiO3, HfZrO2, Hf—Si—O.

In various embodiments, the FE material can be any suitable low voltage FE material that allows the FE material to switch its state by a low voltage (e.g., 100 mV). In at least one embodiment, the FE material comprises a perovskite of the type ABO$_3$, where 'A' and 'B' are two cations of different sizes, and 'O' is oxygen which is an anion that bonds to both the cations. Generally, the size of A atoms is larger than the size of B atoms. In at least one embodiment, the perovskite can be doped (e.g., by La or Lanthanides). Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3 to 2%. For chemically substituted BiFeO3, BiCrO3, BiCoO3 class of materials, La or rare earth substitution into the Bi site can tune the spontaneous distortion. In at least one embodiment, perovskite includes one of: BaTiO3, KNbO3, or NaTaO3.

Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of the FE layer. A perfect epitaxial, crystalline FE layer will show higher squareness (e.g., ratio is closer to 1) compared to a poly crystalline FE. This perfect epitaxial can be accomplished by the use of lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In at least one embodiment, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O14, LaNiO3, and ReO3.

In at least one embodiment, the FE material comprises a stack of layers including low voltage FE material between conductive oxides. In various embodiments, when FE material is a perovskite, the conductive oxides are of the type AA'BB'O$_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In at least one embodiment, the FE material comprises hexagonal ferroelectrics of the type h-RMnO3, where R is a rare earth element such as: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In at least one embodiment, hexagonal FE includes one of: YMnO3 or LuFeO3. In various embodiments, when the FE material comprises hexagonal ferroelectrics, the conductive oxides adjacent to the FE material are of A2O3 (e.g., In2O3, Fe2O3) and AB2O3 type, where 'A' is a rare earth element and B is Mn.

In at least one embodiment, FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials. While various embodiments here are described with reference to ferroelectric material for storing the charge state, the embodiments are also applicable for paraelectric material. For example, the capacitor of various embodiments can be formed using paraelectric material instead of ferroelectric material.

In at least one embodiment, the FE material includes one of: Hafnium (Hf), Zirconium (Zr), Aluminum (Al), Silicon (Si), their oxides or their alloyed oxides. In at least one embodiment, FE material includes one of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In at least one embodiment, the FE material includes Bismuth ferrite (BFO) or BFO with doping material.

In at least one embodiment, the FE material includes Bismuth ferrite (BFO), BFO with a first doping material where in the first doping material is one of Lanthanum, or any element from the lanthanide series of the periodic table. In at least one embodiment, the FE material includes a relaxor ferroelectric including one of Barium Titanium-Bismuth Zinc Niobium Tantalum (BT-BZNT), or Barium Titanium-Barium Strontium Titanium (BT-BST).

In at least one embodiment, the FE material includes Hafnium oxides of the form, Hf1-x Ex Oy where E can be Al, Ca, Ce, Dy, Er, Gd, Ge, La, Sc, Si, Sr, Sn, or Y. In at least one embodiment, FE material 105 includes Niobate type compounds LiNbO3, LiTaO3, Lithium iron Tantalum Oxy Fluoride, Barium Strontium Niobate, Sodium Barium Niobate, or Potassium strontium niobate.

In at least one embodiment, the FE material comprises multiple layers. For example, alternating layers of [Bi2O2] 2+, and pseudo-perovskite blocks (Bi4Ti3O12 and related Aurivillius phases), with perovskite layers that are n octahedral layers in thickness can be used.

In at least one embodiment, the FE material comprises organic material. For example, Polyvinylidene fluoride or polyvinylidene difluoride (PVDF). The FE material is between two electrodes. These electrodes are conducting electrodes. In at least one embodiment, the electrodes are perovskite templated conductors. In such a templated structure, a thin layer (e.g., approximately 10 nm) of a perovskite conductor (such as SrRuO3) is coated on top of IrO2, RuO2, PdO2, or PtO2 (which have a non-perovskite structure but higher conductivity) to provide a seed or template for the growth of pure perovskite ferroelectric at low temperatures. In at least one embodiment, when the ferroelectric comprises hexagonal ferroelectric material, the electrodes can have hexagonal metals, spinels, or cubic metals. Examples of hexagonal metals include: PtCoO2, PdCoO2, and other delafossite structured hexagonal metallic oxides such as Al-doped ZnO. Examples of spinels include Fe3O4 and LiV2O4. Examples of cubic metals include Indium Tin Oxide (ITO) such as Sn-doped In2O3.

The charge developed on node Vs produces a voltage and current that is the output of the majority gate 1400. Any suitable driver 1401 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, multiplexers, etc.

The majority function is performed at the summing node Vs, and the resulting voltage is projected on to capacitance of driver circuitry 1401. For example, the majority function of the currents ($I_a$, $I_b$, and $I_c$) on node Vs results in a resultant current that charges capacitor 105. Table 1 illustrates the majority function f(Majority a, b, c).

TABLE 1

| a | b | c | Vs (f(Majority a, b, c)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

The charge developed on node Vs produces a voltage and current that is the output of the majority gate 1400. Any suitable driver 1401 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, multiplexers, etc.

While FIG. 14 illustrates a 3-input majority gate, the same concept can be extended to more than 3 inputs to make an N-input majority gate, where N is greater than 2. In various embodiments, 'N' is an odd number. For example, a 5-input majority gate is similar to an input majority gate 1400 but for additional inputs 'd' and 'e'. These inputs can come from the same drivers or from different drivers.

In at least one embodiment, the 3-input majority gate can be configured as a fast inverter with a much faster propagation delay compared to a similar sized (in terms of area footprint) CMOS inverter. This is particularly useful when the inputs have a significantly slower slope compared to the propagation delay through the non-linear input capacitors. One way to configure the 3-input majority gate as an inverter is to set one input to a logic high (e.g., b=1) and set another input to a logic low (e.g., b=0). The third input is the driving input which is to be inverted. The inversion will be at the Vs node. The same technique can also be applied to N-input majority gate, where 'N' is 1 or any other odd number. In an N-input majority gate, (N−1)/2 inputs are set to '1' and (N−1)/2 inputs are set to '0', and one input is used to decide the inversion function. The various embodiments are described as a majority gate, the same concepts are applicable to a minority gate. In a minority gate the driving circuitry is an inverting circuitry coupled to the summing node Vs. The minority function is seen at the output of the inverting circuitry.

In at least one embodiment, (2N−1) input majority gate can operate as an N-input AND gate where (N−1) inputs of the majority gate are set to zero. The AND function will be seen at the summing node Vs. Similarly, N-input NAND, OR, NOR gates can be realized. In various embodiments, the summing node Vs is driven by a driver circuitry (e.g., inverter, buffer, NAND gate, AND gate, OR gate, NOR gate, or any other logic circuitry). However, driver circuitry 1401 can be replaced with another majority or minority gate. In one such embodiment, the storage node Vs is directly coupled to a non-linear capacitor of another majority or minority gate.

Any logic function $f(x_1, x_2, \ldots x_n)$ can be represented by two levels of logic as given by the min-term expansion: $f(x_1, x_2, \ldots x_n) = V_{C_1, C_2, \ldots C_n} f(x_1, x_2, \ldots x_n) \wedge x_1^{C_1} \wedge x_2^{C_2} \wedge x_3^{C_3} \ldots \wedge x_n^{C_n}$ where $C_i$ is either 0 or 1. When $C_i$ is 1, $x_i^{C_i} = x_i$ (the input is used in its original form). When $C_i$ is 0, $x_i^{C_i} = \overline{x_i}$ (the input is used in its inverted form). The first level of logic is represented by at most $2^n$ AND gates ($\wedge$), one for each of the $2^n$ possible combinations of 0 and 1 for $C_1, C_2, \ldots$ $C_n$. The second level of logic is represented by a OR gate ($\vee$). Each operand of the OR gate is a representation of a row in the truth table for $f(x_1, x_2, \ldots x_n)$.

A (2N-1)-input majority gate can represent an N-input AND gate, by tying (N-1) of the majority gate's inputs to a ground level. Similarly, a (2N-1)-input majority gate can represent an N-input OR gate, by tying (N-1) of the majority gate's inputs to a supply level (Vdd). Since a majority gate can represent AND and OR gates, and the inputs to the AND and OR gates are either original or inverted forms of the input digital signals, any logic function can be represented by majority gates and inverters only, in accordance with at least one embodiment.

Figure 15:
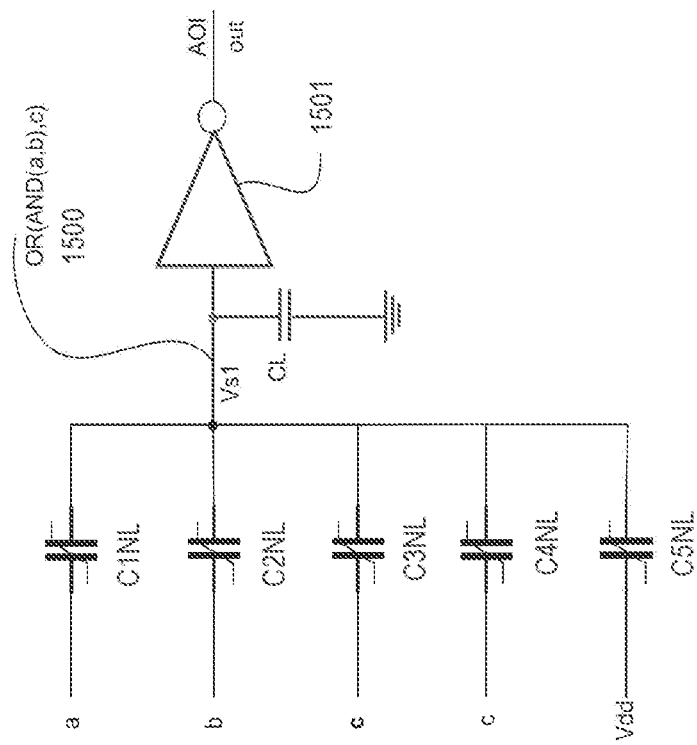
FIG. 15 illustrates a complex logic gate implemented using a 5-input majority gate, in accordance with at least one embodiment.

FIG. 15 illustrates complex logic gate 1500 implemented using a 5-input majority gate, in accordance with at least one embodiment. In at least one embodiment, an AOI (and-or-invert) logic comprises a 5-input majority gate. The 5-input majority gate includes non-linear capacitors C1n1, C2n1, C3n1, C4n1, and C5n1 and driving circuitry 1501 coupled as shown. In various embodiments, two of the non-linear capacitors receives the same input. Here, capacitors C3n1 and C4n1 receive input 'c'. In various embodiments, C5n1 is coupled to Vdd to produce an OR function at node Vs, where the OR function is OR(AND(a,b),c). In at least one embodiment, other logic gates can be realized by changing Vdd to ground for capacitor C5n1, and/or changing other inputs.

Following examples are provided that illustrate the various embodiments. The examples can be combined with other examples. As such, various embodiments can be combined with other embodiments without changing the scope of the invention.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

Example 1: A device comprising: a first region. The first region comprising: a plurality of first conductive interconnects within a first level; a second level above the first level, the second level comprising: a plurality of ferroelectric memory devices, wherein an individual ferroelectric memory device in the plurality of ferroelectric memory devices is above a respective first conductive interconnect in the plurality of first conductive interconnects, and wherein the individual ferroelectric memory device in the plurality of ferroelectric memory devices comprises a first height; an encapsulation layer on a sidewall of the individual ferroelectric memory device in the plurality of ferroelectric memory devices; a via electrode on the individual ferroelectric memory device in the plurality of ferroelectric memory devices, wherein the via electrode comprises a second height; and a second region adjacent to the first region, the second region comprising an interconnect structure, the interconnect structure comprising: one or more second conductive interconnects within the first level; an etch stop layer comprising a dielectric material in the second level; a plurality of metal lines above the etch stop layer, wherein the plurality of metal lines is within the second level, wherein a respective individual metal line in the plurality of metal lines comprises a third height; and a via structure coupling a metal line in the plurality of metal lines with a second conductive interconnect in the one or more second conductive interconnects, wherein the via structure is in the second level and comprises a fourth height, wherein a combined sum of the first height and the second height is equal to a combined sum of the third height and the fourth height.

Example 2: The device of example 1, wherein individual ones of the plurality of first conductive interconnects comprises one or more of copper, cobalt, tungsten, ruthenium, molybdenum, tantalum or titanium and wherein individual ones of the plurality of first conductive interconnects comprises a first lateral thickness.

Example 3: The device of example 2, wherein individual ones of the plurality of first conductive interconnects comprises copper and one or more of titanium or ruthenium, wherein individual ferroelectric memory devices in the plurality of ferroelectric memory devices comprise a respective second lateral thickness, and wherein the second lateral thickness is greater than the first lateral thickness.

Example 4: The device of example 3, wherein the individual ferroelectric memory devices in the plurality of ferroelectric memory devices further extend over portions of a dielectric adjacent to the individual ones of the plurality of first conductive interconnects.

Example 5: The device of example 2, wherein individual ones of the plurality of first conductive interconnects comprises one or more of copper, cobalt, tungsten, ruthenium, molybdenum, tantalum or titanium but not copper, wherein the individual ferroelectric memory devices in the plurality of ferroelectric memory devices comprise a respective second lateral thickness, and wherein the second lateral thickness is less than the first lateral thickness.

Example 6: The device of example 1, wherein the second height is greater than the third height, and wherein the first height is less than the fourth height.

Example 7: The device of example 1, wherein the second height is less than the third height and wherein the first height is greater than the fourth height.

Example 8: The device of example 1, wherein the encapsulation layer comprises a thickness between 5 nm and 30 nm as measured from the sidewall of the individual ones of the plurality of ferroelectric memory devices.

Example 9: The device of example 8, wherein the encapsulation layer comprises an outer sidewall opposite to a sidewall that is adjacent to the sidewall of the individual ones of the plurality of ferroelectric memory devices, and wherein the encapsulation layer laterally extends on a portion of an uppermost surface of a dielectric adjacent to the individual ones of the plurality of first conductive interconnects.

Example 10: The device of example 10, wherein the encapsulation layer laterally extends on a portion of an uppermost surface of the dielectric by a distance that is at least 25% of the thickness of the encapsulation layer.

Example 11: The device of example 8, wherein the encapsulation layer comprises an outer sidewall opposite to a sidewall that is adjacent to the sidewall of the individual ones of the plurality of ferroelectric memory devices, and wherein the encapsulation layer laterally extends on a surface of the dielectric by a distance that is at least 25% of the thickness of the encapsulation layer, and wherein the surface of the dielectric is lower than an uppermost surface of the dielectric.

Example 12: The device of example 10, wherein the dielectric has a portion comprising a sidewall that is substantially aligned with the sidewall of the individual ones of the plurality of ferroelectric memory devices and wherein the encapsulation layer extends below an uppermost surface of the dielectric and on a portion of a sidewall of the dielectric.

Example 13: The device of example 8, wherein the surface of the dielectric below the upper most surface is gradually sloped.

Example 14: The device of example 8, wherein the surface of the dielectric below the upper most surface is substantially planar.

Example 15: The device of example 1, wherein the plurality of ferroelectric memory devices is a first plurality of memory devices, wherein the encapsulation layer is a first encapsulation layer, wherein the via electrode is a first via electrode, wherein the device further comprises: a third plurality of conductive interconnects on a plane behind a plane comprising the first plurality of conductive interconnects; a second plurality of ferroelectric memory devices, wherein an individual ferroelectric memory device in the second plurality of ferroelectric memory devices is above a respective conductive interconnect in the plurality of second conductive interconnects, and wherein the individual ferroelectric memory device in the second plurality of ferroelectric memory devices comprises the first height; a second encapsulation layer on a respective sidewall of the individual ferroelectric memory device in the second plurality of ferroelectric memory devices; and a second via electrode on individual ones of the plurality of ferroelectric memory devices, wherein the second via electrode comprises the second height.

Example 16: The device of example 15, wherein the first encapsulation layer is directly adjacent to the sidewall of a first ferroelectric memory device in the first plurality of memory devices and laterally extends towards and merges with the second encapsulation layer that is directly adjacent to the sidewall of the second ferroelectric memory device in the second plurality of memory devices, where the second ferroelectric memory device is directly behind the first ferroelectric memory device.

Example 17: The device of example 16, wherein the first encapsulation layer or the second encapsulation layer between the first ferroelectric memory device and the second ferroelectric memory device has a lateral thickness that is constant along a direction from the first ferroelectric memory device to the second ferroelectric memory device.

Example 18: The device of example 17, wherein first encapsulation layer and the second encapsulation layer comprise the same material, and wherein the first encapsulation layer adjacent to the first plurality of memory devices and the second encapsulation layer adjacent to the second plurality of memory devices merge over the dielectric.

Example 19: A device comprising a first region. The first region comprising: a trench interconnect extending along a first direction; a second level above the first level, the second level comprising: a plurality of ferroelectric memory devices, wherein individual ferroelectric memory devices in the plurality of ferroelectric memory devices are laterally spaced apart above the trench interconnect; an encapsulation layer on sidewalls of the individual ferroelectric memory devices in the plurality of ferroelectric memory devices; a via electrode on a respective individual ferroelectric memory device in the plurality of ferroelectric memory devices; and a second region adjacent to the first region, the second region comprising an interconnect structure, the interconnect structure comprising; one or more conductive interconnects within the first level; an etch stop layer comprising a dielectric material in the second level; a plurality of metal lines above the etch stop layer, the plurality of metal lines in the second level; and a via structure coupling a respective metal line in the plurality of metal lines and a conductive interconnect in the one or more conductive interconnects, and wherein an uppermost surface of the via electrode is co-planar with an uppermost surface of the metal lines.

Example 20: The device of example 19, wherein the trench interconnect comprises one or more of copper, cobalt, tungsten, ruthenium, molybdenum, tantalum or titanium, and wherein the trench interconnect comprises a first lateral thickness.

Example 21: The device of example 20, wherein the trench interconnect comprises copper and one or more of titanium or ruthenium, wherein the individual ferroelectric memory devices in the plurality of ferroelectric memory devices comprise a respective second lateral thickness, and wherein the second lateral thickness is greater than the first lateral thickness.

Example 22: The device of example 19, wherein the individual ferroelectric memory devices in the plurality of ferroelectric memory devices further extend over portions of a dielectric adjacent to sidewalls of the trench interconnect.

Example 23: The device of example 19, wherein individual ones of the plurality of first conductive interconnects comprises one or more of cobalt, tungsten, ruthenium, molybdenum, tantalum or titanium but not copper, wherein the individual ferroelectric memory devices in the plurality of ferroelectric memory devices comprise a respective second lateral thickness, and wherein the second lateral thickness is less than the first lateral thickness.

Example 24: A method of fabricating a device structure, the method comprising: forming a plurality of conductive interconnects in a dielectric in a memory region and one or more conductive interconnects in a logic region; depositing an etch stop layer on the dielectric and on the plurality of conductive interconnects and on the one or more conductive interconnects; etching to remove the etch stop layer from a memory region but not from a logic region; depositing an electrode material on the plurality of conductive interconnects in the memory region and on the etch stop layer in the logic region; forming a plurality of memory devices by etching the material layer stack, wherein the etching forms a memory device of the plurality of memory devices above a respective conductive interconnect in the plurality of conductive interconnects in the memory region; depositing an encapsulation layer on the plurality of memory devices; blanket depositing a dielectric layer on the encapsulation layer; forming one or more openings in the dielectric layer and in the encapsulation layer, the one or more openings exposing the one or more conductive interconnects in the logic region; forming an interconnect via in a respective one or more openings and a metal line on a respective interconnect via; forming an opening above a respective memory device in the plurality of memory devices; and filing the opening above the respective memory device in the plurality of memory devices with a conductive material to form a respective via electrode.

Example 25: The method of example 24, wherein the method further comprises: forming a mask on the encapsulation layer, wherein the mask covers a respective memory device in the plurality of memory devices; and etching the encapsulation layer.

Example 26: A device comprising a first region, the first region comprising: a first conductive interconnect within a first level; a second level above the first level, the second level comprising: a ferroelectric memory device comprising a first height and further comprising a cylindrical shape, the ferroelectric memory device above the first conductive interconnect; an encapsulation layer on a sidewall of the ferroelectric memory device; a via electrode on the ferroelectric memory device, wherein the via electrode comprises a second height; and a second region adjacent to the first region, the second region comprising an interconnect structure, the interconnect structure comprising; a second conductive interconnect within the first level; an etch stop layer comprising a dielectric material in the second level; a metal line above the etch stop layer, wherein the metal line is within the second level and wherein the metal line comprises a third height; and a via structure coupling the metal line with the second conductive interconnect, wherein the via structure is in the second level and comprises a fourth height, wherein a combined sum of the first height and the second height is equal to a combined sum of the third height and the fourth height.

Example 27: The device of example 26, wherein the first conductive interconnect comprises one or more of copper, cobalt, tungsten, ruthenium, molybdenum, tantalum or titanium, wherein the first conductive interconnect comprises a cylindrical profile and wherein the first conductive interconnect comprises a first lateral thickness, wherein the first lateral thickness is a first diameter.

Example 28: The device of example 27, wherein the first conductive interconnect comprises copper and one or more of titanium or ruthenium, wherein the ferroelectric memory device comprises a respective second lateral thickness, wherein the second lateral thickness is a second diameter where the first diameter is less than the second diameter.

Example 29: The device of example 27, wherein the first conductive interconnect comprises one or more of cobalt, tungsten, ruthenium, molybdenum, tantalum or titanium, but not copper, wherein the ferroelectric memory device comprises a respective second lateral thickness, wherein the second lateral thickness is a second diameter where the first diameter is greater than the second diameter.

Example 29: The device of example 27, wherein the first conductive interconnect comprises one or more of cobalt, tungsten, ruthenium, molybdenum, tantalum or titanium, but not copper, wherein the ferroelectric memory device comprises a respective second lateral thickness, wherein the second lateral thickness is a second diameter where the first diameter is less than the second diameter.

Example 30: The device of example 26, wherein the second height is greater than the third height, and wherein the first height is less than the fourth height, and wherein the first height is less than 20 nm and the second height is greater than 50 nm but less than 200 nm.

Example 31: The device of example 26, wherein the ferroelectric memory device is a first memory device, wherein the encapsulation layer is a first encapsulation layer, wherein the via electrode is a first via electrode, wherein the device further comprises: a third conductive interconnect on a plane behind a plane comprising the first conductive interconnect; a second ferroelectric memory device above the third conductive interconnect and wherein the second ferroelectric memory device comprises the first height; a second encapsulation layer on a sidewall of the ferroelectric memory device; and a second via electrode on second ferroelectric memory device, wherein the second via electrode comprises the second height.

Example 32: The device of example 31, wherein the first encapsulation layer and the second encapsulation layer comprise the same material, and wherein the first encapsulation extends along a shortest direction from above the first conductive interconnect to the third conductive interconnect.

Example 33: The device of example 31, wherein the first encapsulation layer is directly adjacent to the sidewall of a first ferroelectric memory device and laterally extends towards and is adjacent to the second encapsulation layer that is directly adjacent to the sidewall of the second ferroelectric memory device, wherein the first encapsulation layer or the second encapsulation layer between the first ferroelectric memory device and the second ferroelectric memory device has a lateral thickness that is constant along a direction from the first ferroelectric memory device to the second ferroelectric memory device, and wherein the lateral thickness is greater than a first diameter of the first ferroelectric memory device or a second diameter of the second ferroelectric memory device by a thickness equivalent to a thickness of the encapsulation layer.

Example 34: The device of example 33, wherein the lateral thickness is greater than a first diameter of the first ferroelectric memory device or a second diameter of the second ferroelectric memory device by a thickness equivalent to a thickness that is at least 25% greater than a thickness of the encapsulation layer.

Example 35: The device of example 31, wherein the first via electrode and the second via electrode are coupled by a plate electrode extending from above the first ferroelectric memory device to a second ferroelectric memory device, wherein the plate electrode is within the second level.

Example 36: The device of example 26, wherein the first ferroelectric memory device comprises a dielectric hardmask, wherein the via electrode is coupled with the first ferroelectric memory device through an opening in the dielectric hardmask.

Example 37: The device of example 26, wherein the first ferroelectric memory device comprises a conductive hardmask, wherein the via electrode is coupled with the first ferroelectric memory device through the conductive hardmask.

Example 38: The device of example 26, wherein the first ferroelectric memory device comprises a dual layer hardmask comprising a first layer that is conductive and a second layer on the first layer, wherein the second layer is a dielectric, wherein the via electrode is coupled with the second layer through the first layer.

Example 39: The device of example 26, wherein the first ferroelectric memory device comprises sidewalls that are substantially vertical respect to a lowermost surface of the first ferroelectric memory device.

Example 41: The device of example 26, wherein the first ferroelectric memory device comprises sidewalls that have a slope that is different from 90° with respect to a lowermost surface of the first ferroelectric memory device.

Example 42: The device of example 26, wherein the device further comprises portion of one or more layers of the ferroelectric memory device adjacent to a sidewall of etch stop layer at a boundary between the memory region and the logic region.

Example 43: A method of fabricating a device structure, the method comprising: forming a plurality of conductive interconnects in a dielectric in a memory region and one or more conductive interconnects in a logic region; depositing an etch stop layer on the dielectric and on the plurality of conductive interconnects and on the one or more conductive interconnects; etching to remove the etch stop layer from a memory region but not from a logic region; depositing an electrode material on the plurality of conductive interconnects in the memory region and on the etch stop layer in the logic region; forming a plurality of memory devices by etching the material layer stack, wherein the etching forms a memory device of the plurality of memory devices above a respective conductive interconnect in the plurality of conductive interconnects in the memory region; depositing an encapsulation layer on the plurality of memory devices; blanket depositing a dielectric layer on the encapsulation layer; forming one or more first openings in the dielectric layer and in the encapsulation layer, the first one or more openings exposing the one or more conductive interconnects in the logic region and simultaneously forming a second one or more openings in the memory region, the second one or more openings exposing one or more devices in the plurality of memory devices; and forming an interconnect via in a respective first one or more openings and a metal line on a respective interconnect via, and forming a conductive via in the second one or more openings to form a respective via electrode by depositing a conductive material in the first and in the second one or more openings.

Example 44: The method of example 43, wherein the method of depositing the encapsulation layer comprises depositing on a surface of a dielectric layer adjacent to the plurality of conductive interconnects, wherein the surface is tapered relative to a sidewall of an individual memory device in the plurality of memory devices.

Example 45: The method of example 44, wherein the method further comprises depositing a portion of the encapsulation layer on a sidewall of the dielectric layer, wherein the sidewall of the dielectric layer and the sidewall of the individual memory device in the plurality of memory devices is substantially aligned.

Example 46: The method of example 43, The method of claim 18, wherein the method of forming the interconnect via in a respective first one or more openings further comprises: masking the second one or more openings and a portion of the first one or more openings; forming a second opening within the portion of the first one or more openings; etching the dielectric exposed by the second opening; and etching the etch stop layer after etching the dielectric, the etching exposing a conductive interconnect in the one or more conductive interconnects in the logic region.

What is claimed is:

1. A device comprising:
   a first region comprising:
      a first conductive interconnect within a first level; and
      a second level above the first level, the second level comprising:
         a ferroelectric memory device comprising a first height and further comprising a cylindrical shape, the ferroelectric memory device above the first conductive interconnect;
      an encapsulation layer on a sidewall of the ferroelectric memory device; and
      a via electrode on the ferroelectric memory device, wherein the via electrode comprises a second height;
   a second region adjacent to the first region, the second region comprising an interconnect structure, the interconnect structure comprising:
      a second conductive interconnect within the first level;
      an etch stop layer comprising a dielectric material in the second level;
      a metal line above the etch stop layer, wherein the metal line is within the second level and wherein the metal line comprises a third height; and
      a via structure coupling the metal line with the second conductive interconnect, wherein the via structure is in the second level and comprises a fourth height, wherein a combined sum of the first height and the second height is equal to a combined sum of the third height and the fourth height; and
   a portion of one or more layers of the ferroelectric memory device adjacent to a sidewall of the etch stop layer at a boundary between the first region and the second region.

2. The device of claim 1, wherein the first conductive interconnect comprises one or more of copper, cobalt, tungsten, ruthenium, molybdenum, tantalum or titanium, wherein the first conductive interconnect comprises a cylindrical profile and wherein the first conductive interconnect comprises a first lateral thickness, and wherein the first lateral thickness is a first diameter.

3. The device of claim 2, wherein the first conductive interconnect comprises copper and one or more of titanium or ruthenium, wherein the ferroelectric memory device comprises a second lateral thickness, and wherein the second lateral thickness is a second diameter and wherein the first diameter is less than the second diameter.

4. The device of claim 2, wherein the first conductive interconnect comprises one or more of cobalt, tungsten, ruthenium, molybdenum, tantalum or titanium, but not copper, wherein the ferroelectric memory device comprises a respective second lateral thickness, wherein the respective second lateral thickness is a second diameter, and wherein the first diameter is greater than the second diameter.

5. The device of claim 1, wherein the second height is greater than the third height, and wherein the first height is less than the fourth height, and wherein the first height is less than 20 nm, and the second height is greater than 50 nm but less than 200 nm.

6. The device of claim 1, wherein the ferroelectric memory device is a first ferroelectric memory device, wherein the encapsulation layer is a first encapsulation layer, wherein the via electrode is a first via electrode, and wherein the device further comprises:
   a third conductive interconnect on a plane behind a plane comprising the first conductive interconnect;
   a second ferroelectric memory device above the third conductive interconnect and wherein the second ferroelectric memory device comprises the first height and further comprising a cylindrical shape;
   a second encapsulation layer on a sidewall of the second ferroelectric memory device; and
   a second via electrode on the second ferroelectric memory device, wherein the second via electrode comprises the second height.

7. The device of claim 6, wherein the first encapsulation layer and the second encapsulation layer comprise a same material, wherein the first encapsulation layer extends along a shortest direction from above the first conductive interconnect to the third conductive interconnect, and wherein the first encapsulation layer is in contact with a dielectric between the first conductive interconnect to the third conductive interconnect.

8. The device of claim 7, wherein the first encapsulation layer is directly adjacent to the sidewall of the first ferroelectric memory device and laterally extends towards and merges with the second encapsulation layer that is directly adjacent to the sidewall of the second ferroelectric memory device, wherein the first encapsulation layer or the second encapsulation layer between the first ferroelectric memory device and the second ferroelectric memory device has a third lateral thickness that is constant along a direction from the first ferroelectric memory device to the second ferroelectric memory device, and wherein the third lateral thickness is greater than a first diameter of the first ferroelectric memory device or a second diameter of the second ferroelectric memory device by a thickness equivalent to a fourth lateral thickness of the encapsulation layer.

9. The device of claim 8, wherein the third lateral thickness is at least 25% greater than the fourth lateral thickness of the encapsulation layer.

10. The device of claim 6, wherein the first via electrode and the second via electrode are coupled by a plate electrode extending from above the first ferroelectric memory device to a second ferroelectric memory device, and wherein the plate electrode is within the second level.

11. The device of claim 1, wherein the ferroelectric memory device comprises a dielectric hardmask, and wherein the via electrode is coupled with the ferroelectric memory device through an opening in the dielectric hardmask.

12. The device of claim 1, wherein the ferroelectric memory device comprises a conductive hardmask, and wherein the via electrode is coupled with the ferroelectric memory device through the conductive hardmask.

13. The device of claim 1, wherein the ferroelectric memory device comprises a dual layer hardmask comprising a first layer that is conductive and a second layer on the first layer, wherein the second layer is a dielectric, and wherein the via electrode is coupled with the first layer through the second layer.

14. The device of claim 1, wherein the ferroelectric memory device comprises sidewalls that have a slope that is different from 90° with respect to a lowermost surface of the ferroelectric memory device, and wherein the ferroelectric memory device comprises a ferroelectric material which includes one of:
bismuth ferrite (BFO) with a first doping material wherein the first doping material is one of lanthanum or elements from lanthanide series of periodic table;
lead zirconium titanate (PZT) or PZT with a second doping material, wherein the second doping material is one of La or Nb;
a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST);
a perovskite material which includes one of: BaTiO3, PbTiO3, KNbO3, or NaTaO3;
a first hexagonal ferroelectric which includes one of: YMnO3 or LuFeO3;
a second hexagonal ferroelectric of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
Hafnium (Hf), Zirconium (Zr), Aluminum (Al), Silicon (Si), their oxides or their alloyed oxides; Hafnium oxides as Hf1-x Ex Oy, where E can be Al, Ca, Ce, Dy, Er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, wherein 'x' is a fraction;
niobate type compounds LiNbO3, LiTaO3, lithium iron tantalum oxy fluoride, barium strontium niobate, sodium barium niobate, or potassium strontium niobate; or
an improper ferroelectric material which includes one of: [PTO/STO]n or [LAO/STO]n, where 'n' is between 1 and 100.

15. A system comprising:
a processor;
a communication interface communicatively coupled to the processor; and
a memory coupled to the processor, wherein the memory comprises: bit-cells, wherein one of the bit-cells includes:
a first region comprising:
a first conductive interconnect within a first level; and
a second level above the first level, the second level comprising:
a ferroelectric memory device comprising a first height and further comprising a cylindrical shape, the ferroelectric memory device above the first conductive interconnect;
an encapsulation layer on a sidewall of the ferroelectric memory device; and
a via electrode on the ferroelectric memory device, wherein the via electrode comprises a second height;
a second region adjacent to the first region, the second region comprising an interconnect structure, the interconnect structure comprising:
a second conductive interconnect within the first level;
an etch stop layer comprising a dielectric material in the second level;
a metal line above the etch stop layer, wherein the metal line is within the second level and wherein the metal line comprises a third height; and
a via structure coupling the metal line with the second conductive interconnect, wherein the via structure is in the second level and comprises a fourth height, wherein a combined sum of the first height and the second height is equal to a combined sum of the third height and the fourth height; and
a portion of one or more layers of the ferroelectric memory device adjacent to a sidewall of the etch stop layer at a boundary between the first region and the second region.

16. The system of claim 15, wherein the ferroelectric memory device comprises a ferroelectric material which includes one of:
bismuth ferrite (BFO) with a first doping material, wherein the first doping material is one of lanthanum or elements from lanthanide series of periodic table;
lead zirconium titanate (PZT) or PZT with a second doping material, wherein the second doping material is one of La or Nb;
a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST);
a perovskite material which includes one of: BaTiO3, PbTiO3, KNbO3, or NaTaO3;
a first hexagonal ferroelectric which includes one of: YMnO3 or LuFeO3;

a second hexagonal ferroelectric of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);

Hafnium (Hf), Zirconium (Zr), Aluminum (Al), Silicon (Si), their oxides or their alloyed oxides; Hafnium oxides as $Hf_{1-x}E_xO_y$, where E can be Al, Ca, Ce, Dy, Er, Gd, Ge, La, Sc, Si, Sr, Sn, Zr, or Y; $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, wherein 'x' is a fraction;

niobate type compounds LiNbO3, LiTaO3, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 and 100.

\* \* \* \* \*